(12) United States Patent
Said et al.

(10) Patent No.: US 11,296,028 B2
(45) Date of Patent: Apr. 5, 2022

(54) SEMICONDUCTOR DEVICE CONTAINING METAL-ORGANIC FRAMEWORK INTER-LINE INSULATOR STRUCTURES AND METHODS OF MANUFACTURING THE SAME

(71) Applicant: SANDISK TECHNOLOGIES LLC, Addison, TX (US)

(72) Inventors: Ramy Nashed Bassely Said, San Jose, CA (US); Senaka Kanakamedala, San Jose, CA (US); Fei Zhou, San Jose, CA (US); Raghuveer S. Makala, Campbell, CA (US); Yao-Sheng Lee, Tampa, FL (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 24 days.

(21) Appl. No.: 16/722,824

(22) Filed: Dec. 20, 2019

(65) Prior Publication Data
US 2021/0193585 A1    Jun. 24, 2021

(51) Int. Cl.
| | |
|---|---|
| *H01L 23/522* | (2006.01) |
| *H01L 23/532* | (2006.01) |
| *H01L 23/528* | (2006.01) |
| *H01L 27/11556* | (2017.01) |
| *H01L 27/1157* | (2017.01) |

(Continued)

(52) U.S. Cl.
CPC .... *H01L 23/53295* (2013.01); *H01L 23/5226* (2013.01); *H01L 23/5283* (2013.01); *H01L 23/53209* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
CPC ......... H01L 23/53295; H01L 23/53209; H01L 23/5226; H01L 27/11582; H01L 27/11556
See application file for complete search history.

(56) References Cited

U.S. PATENT DOCUMENTS

| | | |
|---|---|---|
| 5,882,548 A | 3/1999 | Liang et al. |
| 5,915,167 A | 6/1999 | Leedy |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Sarah K Salerno
(74) *Attorney, Agent, or Firm* — The Marbury Law Group PLLC

(57) ABSTRACT

A structure, such as a semiconductor device, includes metal line structures located over a substrate and laterally spaced apart from each other. Each of the metal line structures includes planar metallic liner including a first metal element and a metal line body portion includes a second metal element that is different from the first metal element. Metal-organic framework (MOF) material portions are located between neighboring pairs of the metal line structures and contain metal ions or clusters of the first metal element and organic ligands connected to the metal ions or clusters of the first metal element. Air gaps may be formed in the MOF material portions to further reduce the effective dielectric constant.

20 Claims, 38 Drawing Sheets

(51) Int. Cl.
*H01L 27/11582* (2017.01)
*H01L 27/11519* (2017.01)
*H01L 27/11524* (2017.01)
*H01L 27/11565* (2017.01)

(56) References Cited

U.S. PATENT DOCUMENTS

| | | | |
|---|---|---|---|
| 8,123,834 | B2 | 2/2012 | Masel et al. |
| 8,349,681 | B2 | 1/2013 | Alsmeier et al. |
| 8,603,225 | B2 | 12/2013 | Schubert et al. |
| 9,252,151 | B2 | 2/2016 | Chien et al. |
| 9,346,831 | B1 | 5/2016 | Talin et al. |
| 9,356,031 | B2 | 5/2016 | Lee et al. |
| 9,397,093 | B2 | 7/2016 | Makala et al. |
| 9,419,012 | B1 | 8/2016 | Shimabukuro et al. |
| 9,428,525 | B1 | 8/2016 | Talin et al. |
| 9,515,085 | B2 | 12/2016 | Rabkin et al. |
| 9,576,975 | B2 | 2/2017 | Zhang et al. |
| 9,691,884 | B2 | 6/2017 | Makala et al. |
| 9,724,668 | B2 | 8/2017 | Zhou et al. |
| 9,875,929 | B1 | 1/2018 | Shukla et al. |
| 9,960,181 | B1* | 5/2018 | Cui .................. H01L 27/11548 |
| 9,983,124 | B2 | 5/2018 | Wang et al. |
| 10,094,020 | B2 | 10/2018 | Stassen et al. |
| 10,256,247 | B1 | 4/2019 | Kanakamedala et al. |
| 10,274,421 | B2 | 4/2019 | Chang et al. |
| 2010/0064888 | A1 | 3/2010 | Schubert et al. |
| 2010/0132547 | A1 | 6/2010 | Masel et al. |
| 2016/0093635 | A1* | 3/2016 | Rabkin ............ H01L 27/11524 |
| | | | 257/314 |
| 2016/0159822 | A1 | 6/2016 | Tan et al. |
| 2016/0229873 | A1 | 8/2016 | Talin et al. |
| 2016/0231233 | A1 | 8/2016 | Wang et al. |
| 2016/0346759 | A1 | 12/2016 | Zhou et al. |
| 2017/0044428 | A1 | 2/2017 | Li et al. |
| 2017/0198393 | A1* | 7/2017 | Stassen ............ C23C 16/45523 |
| 2018/0001101 | A1 | 1/2018 | Chang et al. |
| 2019/0024235 | A1 | 1/2019 | Stassen et al. |

OTHER PUBLICATIONS

Stassin, T. et al., "Vapour-Phase Deposition of Oriented Copper Dicarboxylate Metal-Organic Framework Thin Films," *Chemical Communications* 55.68 (2019): 10056-10059.

Krishtab, M. et al., "Vapor-Deposited Zeolitic Imidazolate Frameworks as Gap-Filling Ultra-Low-k Dielectrics," Nature Communications, pp. 1-9, (2019) 10:3729 | https://doi.org/10.1038/s41467-019-11703-x | www.nature.com/naturecommunications.

Perez, E. V. et al., "Origins and Evolution of Inorganic-Based and MOF-Based Mixed-Matrix Membranes for Gas Separations," Processes 2016, vol. 4, No. 32, pp. 1-68; (2016) doi:10.3390/pr4030032, www.mdpi.com/journal/processes.

Ameloot, R. "MOF-CVD Chemical Vapor Deposition of Metal-Organic Frameworks," International MicroNano Conference, Dec. 13-14, 2016, Amsterdam, NL, 43 pages, (2016), https://www.micronanoconference.org/app/uploads/sites/57/2016/12/Porous-Crystals-from-the-Vapor-Phase_Rob-Ameloot_KU-Leuven.pdf.

Hendon, C.H., et al. "Engineering the optical response of the titanium-MIL-125 metal—organic framework through ligand functionalization." *Journal of the American Chemical Society* 135. 30 (2013): 10942-10945.

Kramer, M. et al., "Synthesis and properties of the metal-organic framework Mo 3 (BTC) 2 (TUDMOF-1)," *Journal of Materials Chemistry*, vol. 16, No. 23 (2006): pp. 2245-2248.

Park, S.J. et al., "A mechanistic study of SF6/O2 reactive ion etching of molybdenum," Citation: Journal of Vacuum Science & Technology B: Microelectronics Processing and Phenomena, vol. 5, pp. 1372-1373, (1987);doi: 10.1116/1.583618 1372-1373.

U.S. Appl. No. 16/278,426, filed Feb. 18, 2019 SanDisk Technologies LLC.

U.S. Appl. No. 16/278,488, filed Feb. 18, 2019 SanDisk Technologies LLC.

Said, R.N.B et al., "Three-Dimensional Memory Device Containing Metal-Organic Framework Inter-Word Line Insulating Layers and Methods of Forming the Same," U.S. Appl. No. 16/722,745, filed Dec. 20, 2019.

* cited by examiner

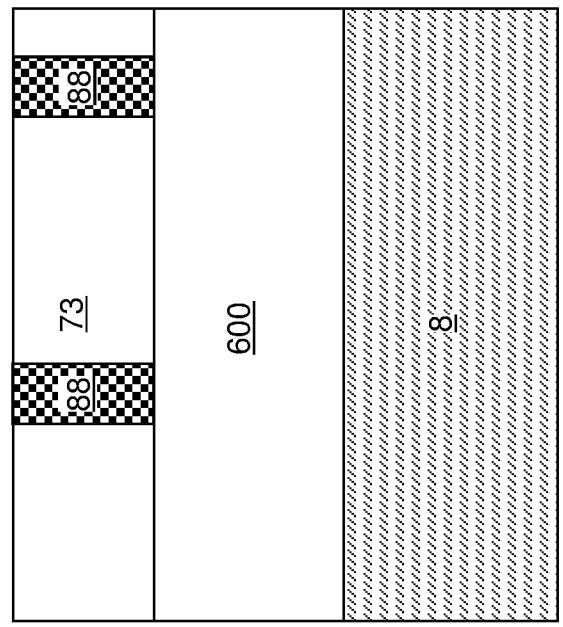
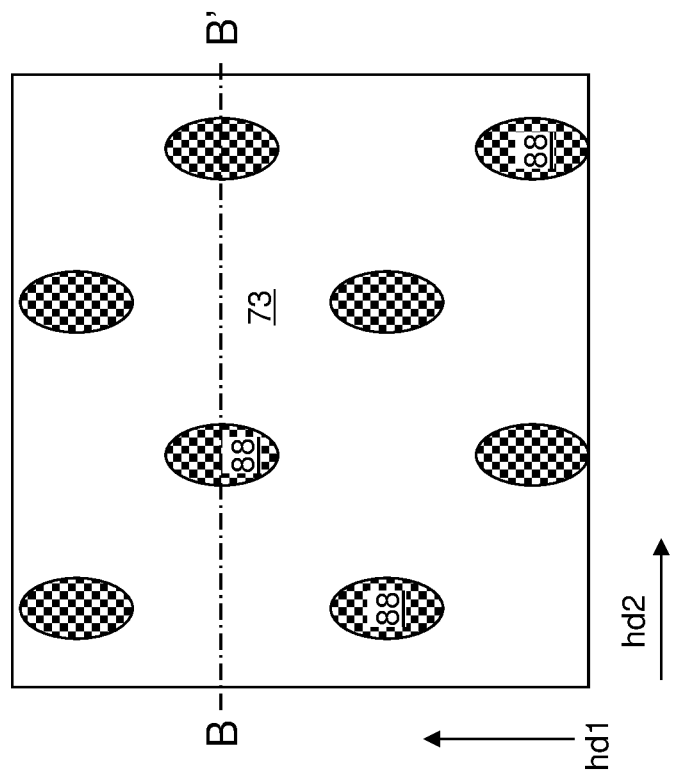
FIG. 1B
FIG. 1A

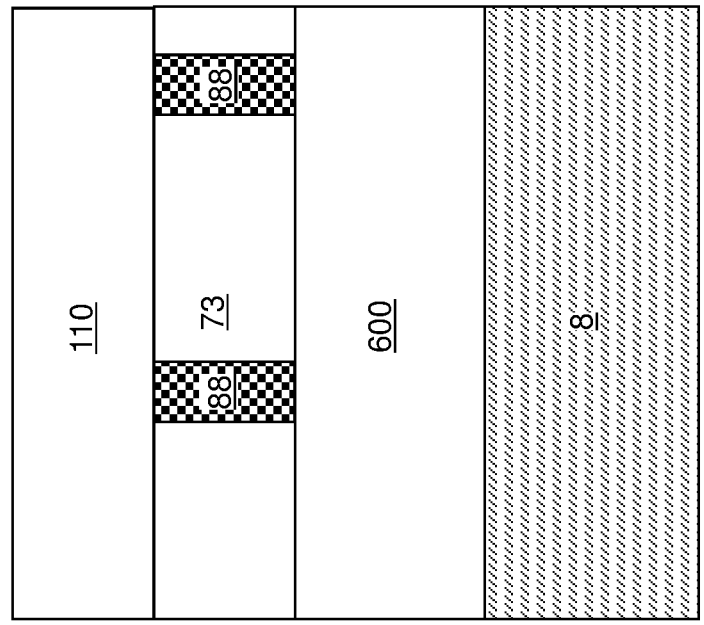
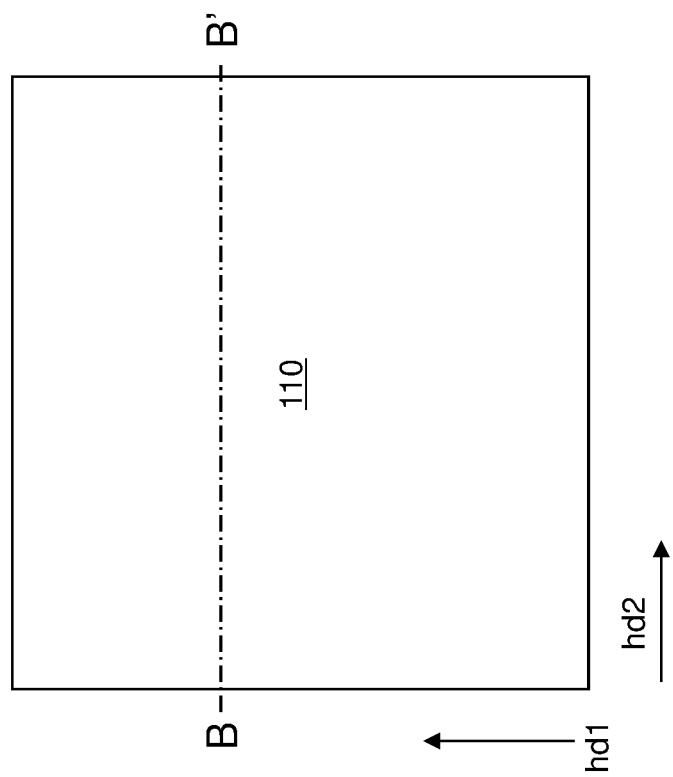

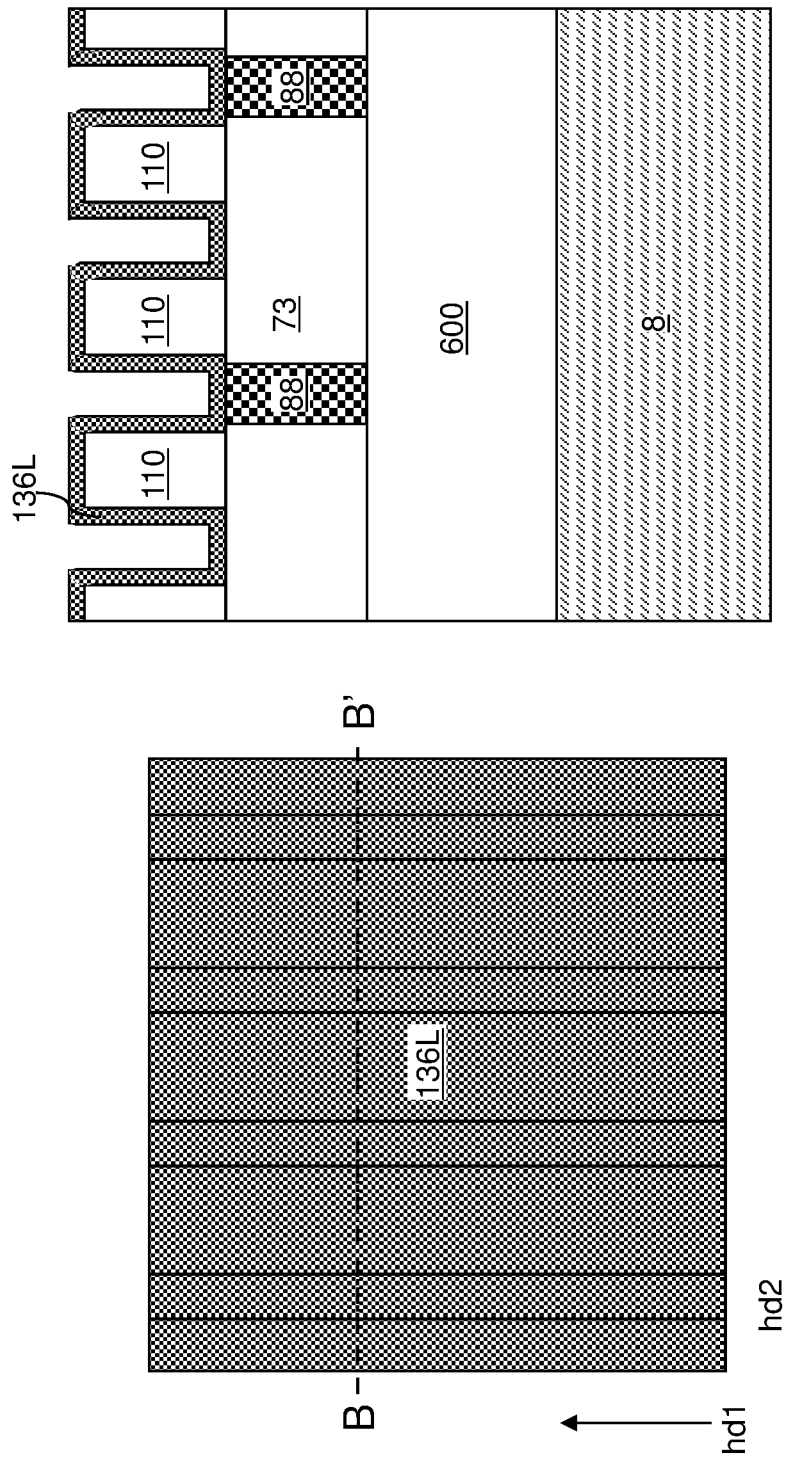

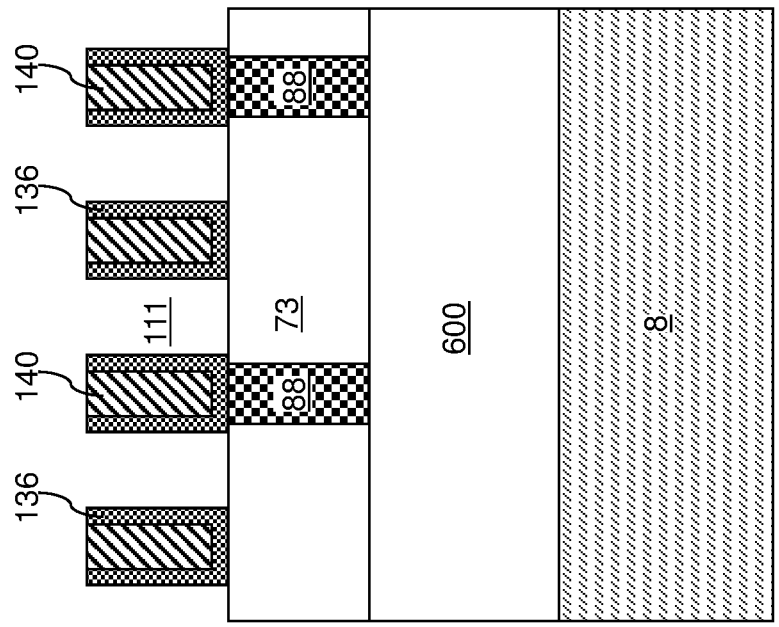
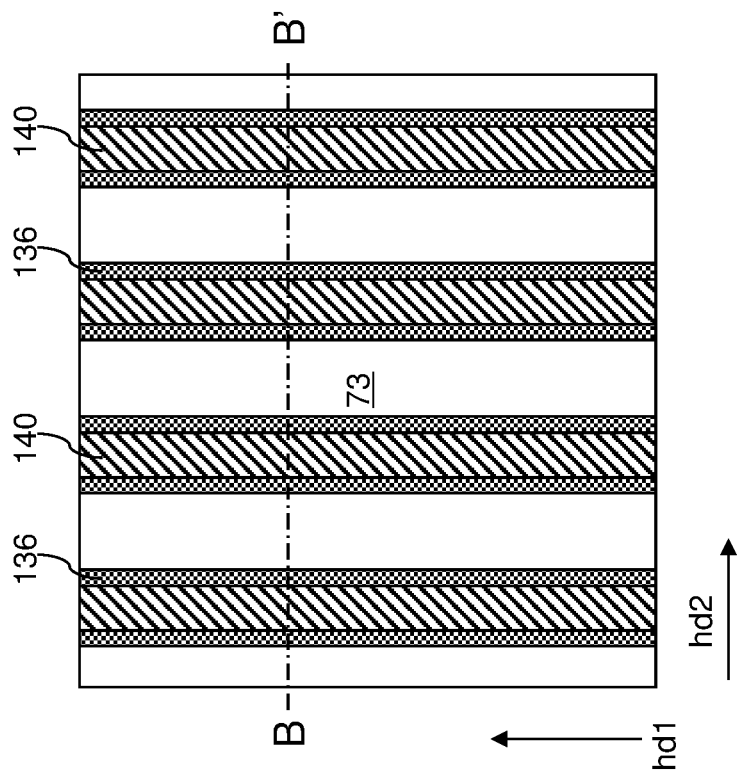
FIG. 7B
FIG. 7A

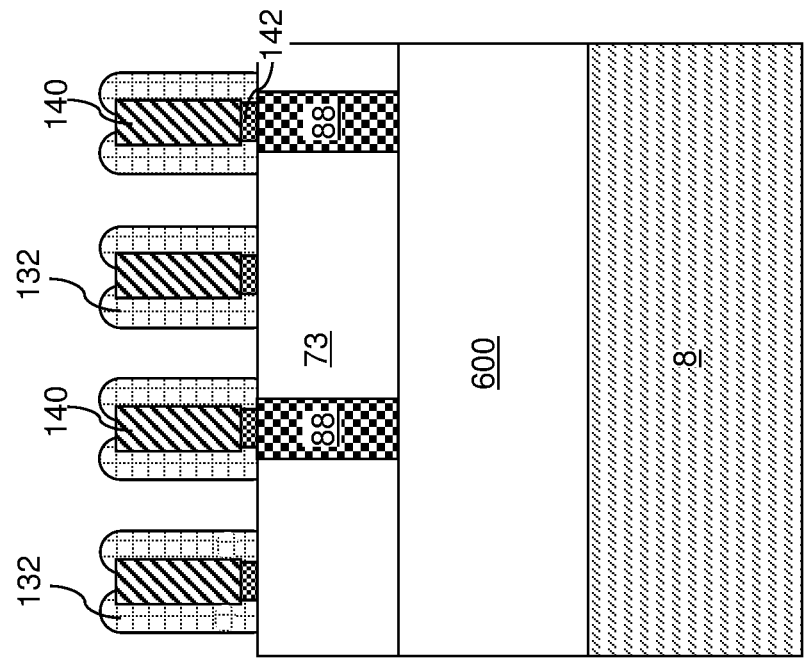
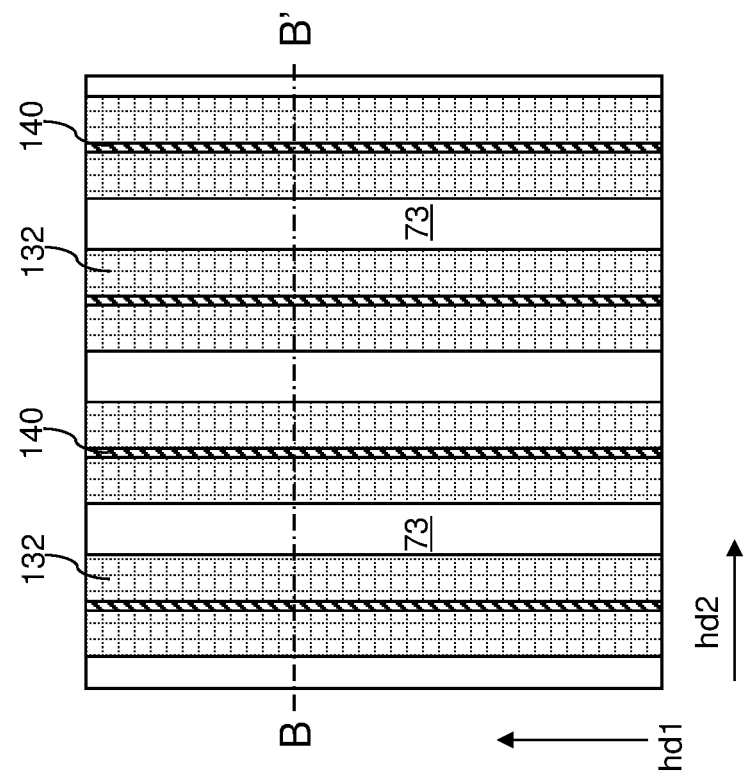
FIG. 12A
FIG. 12B

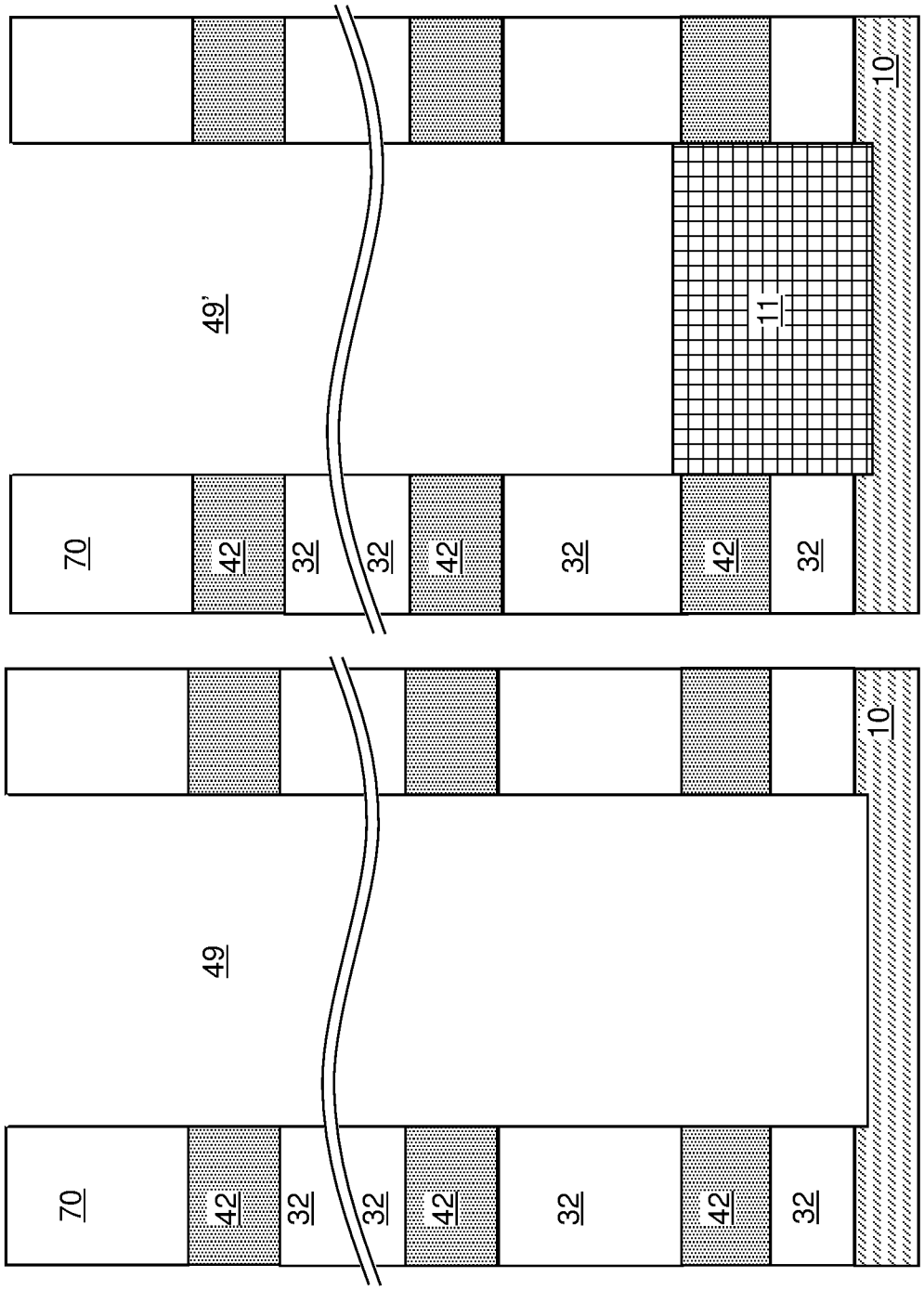

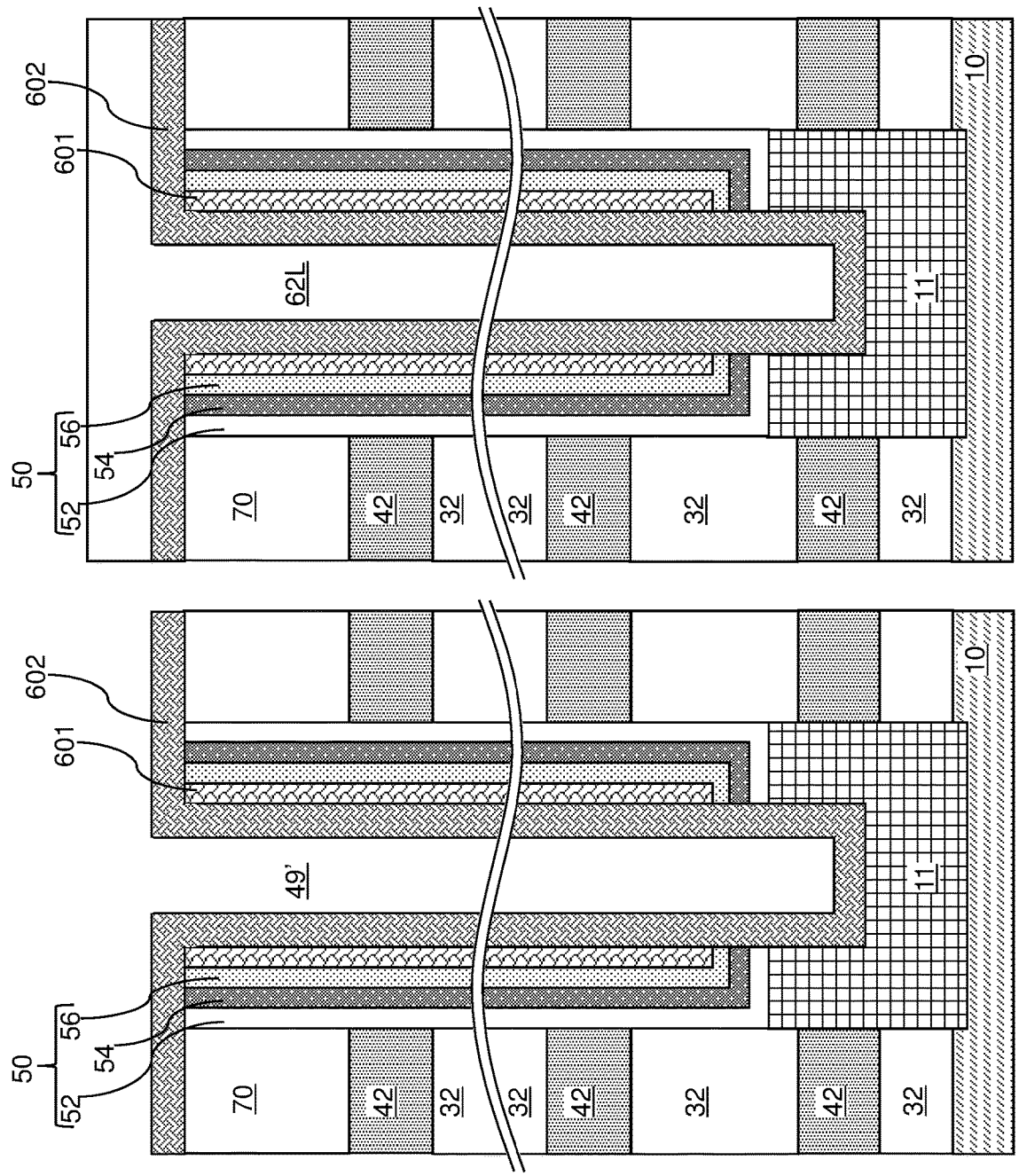

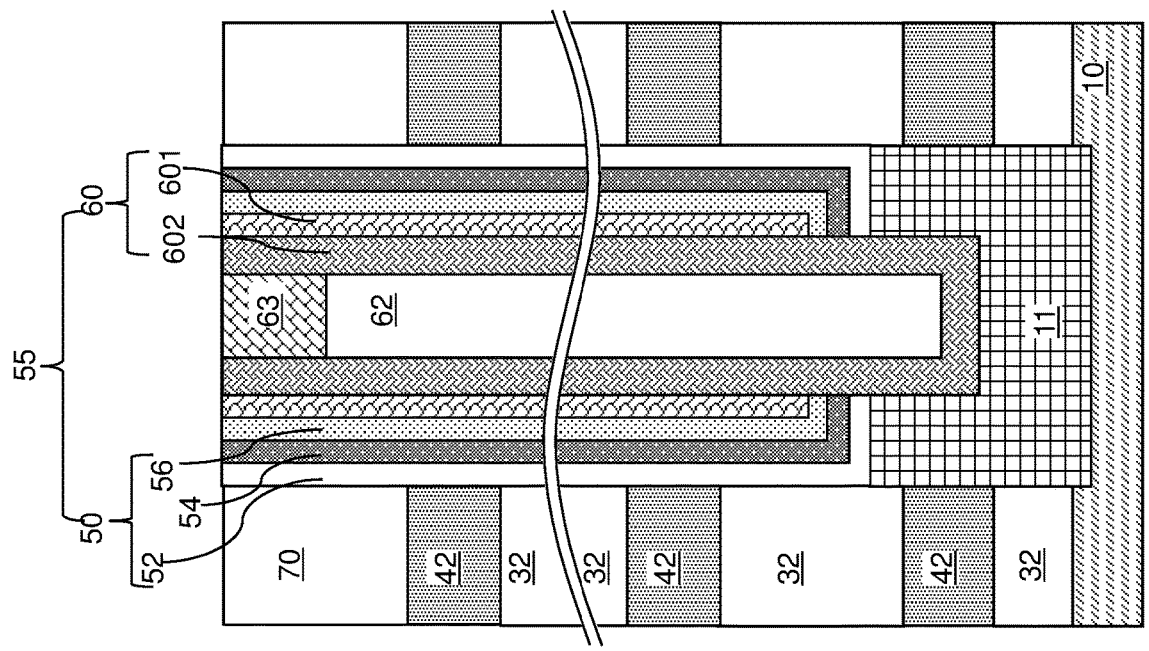
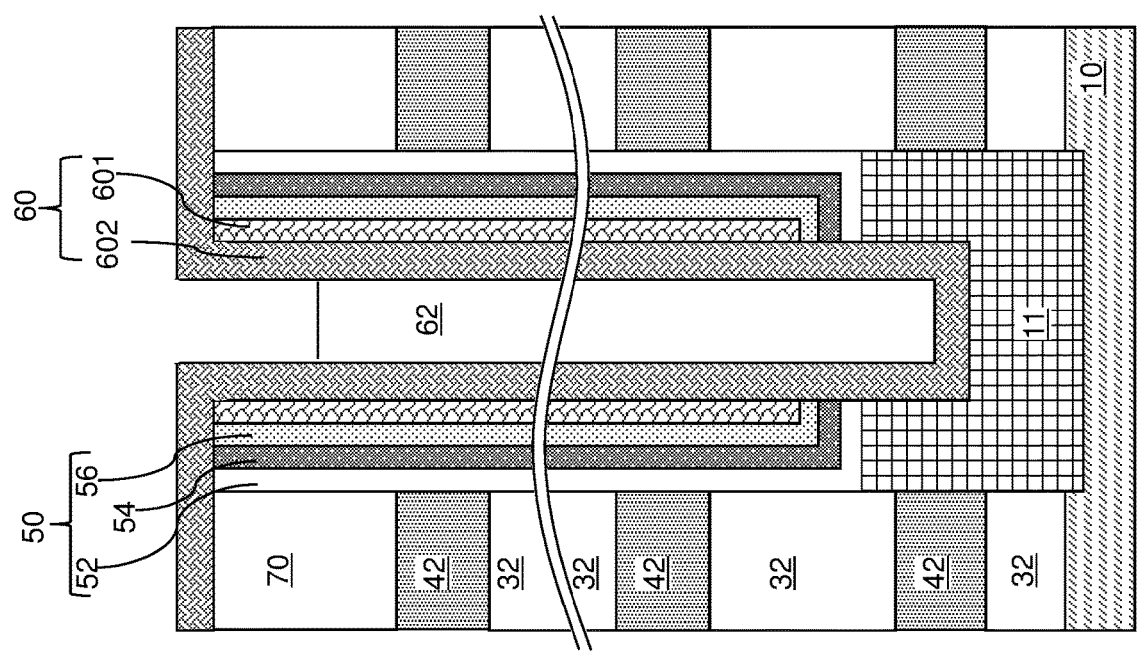

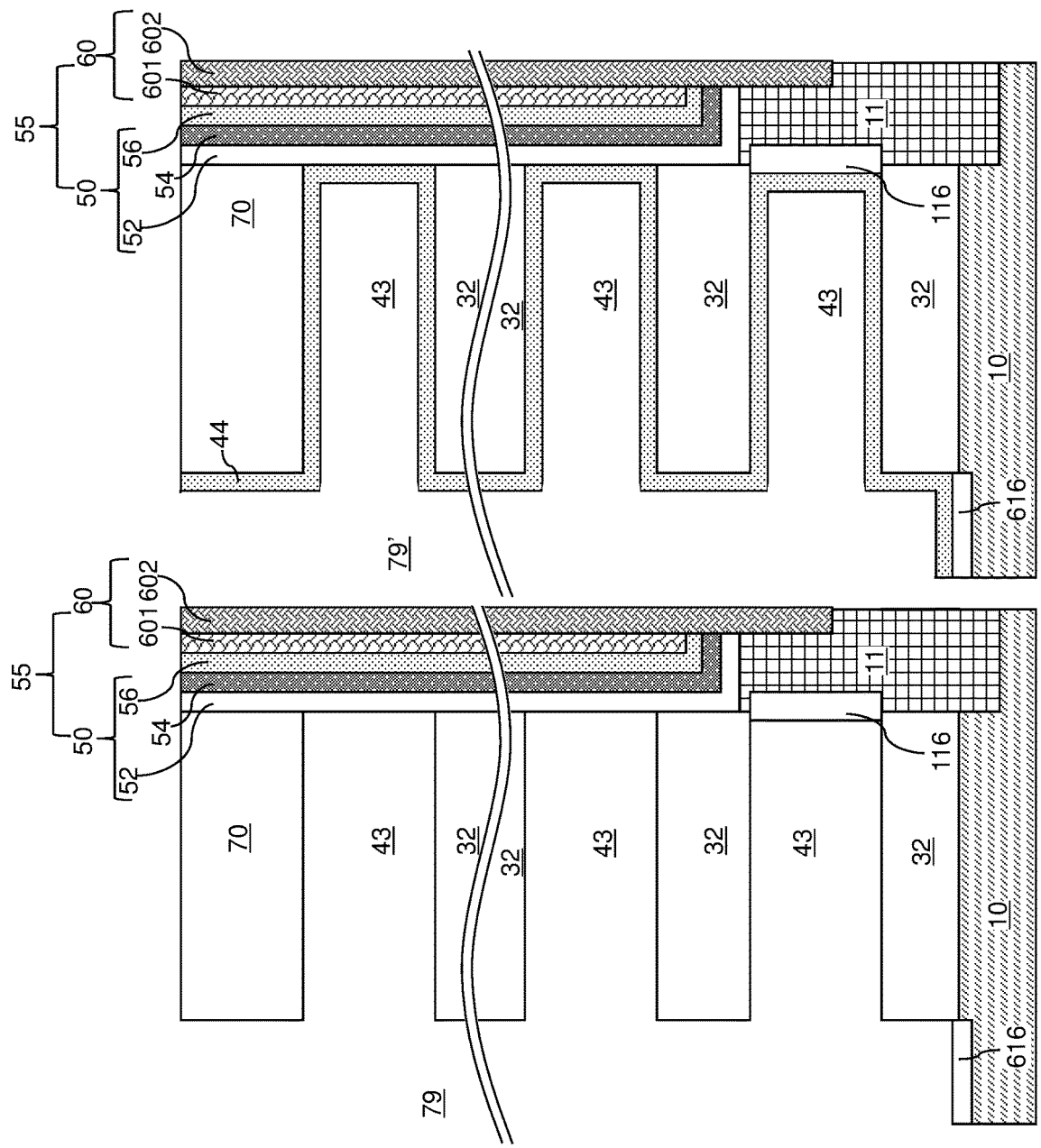

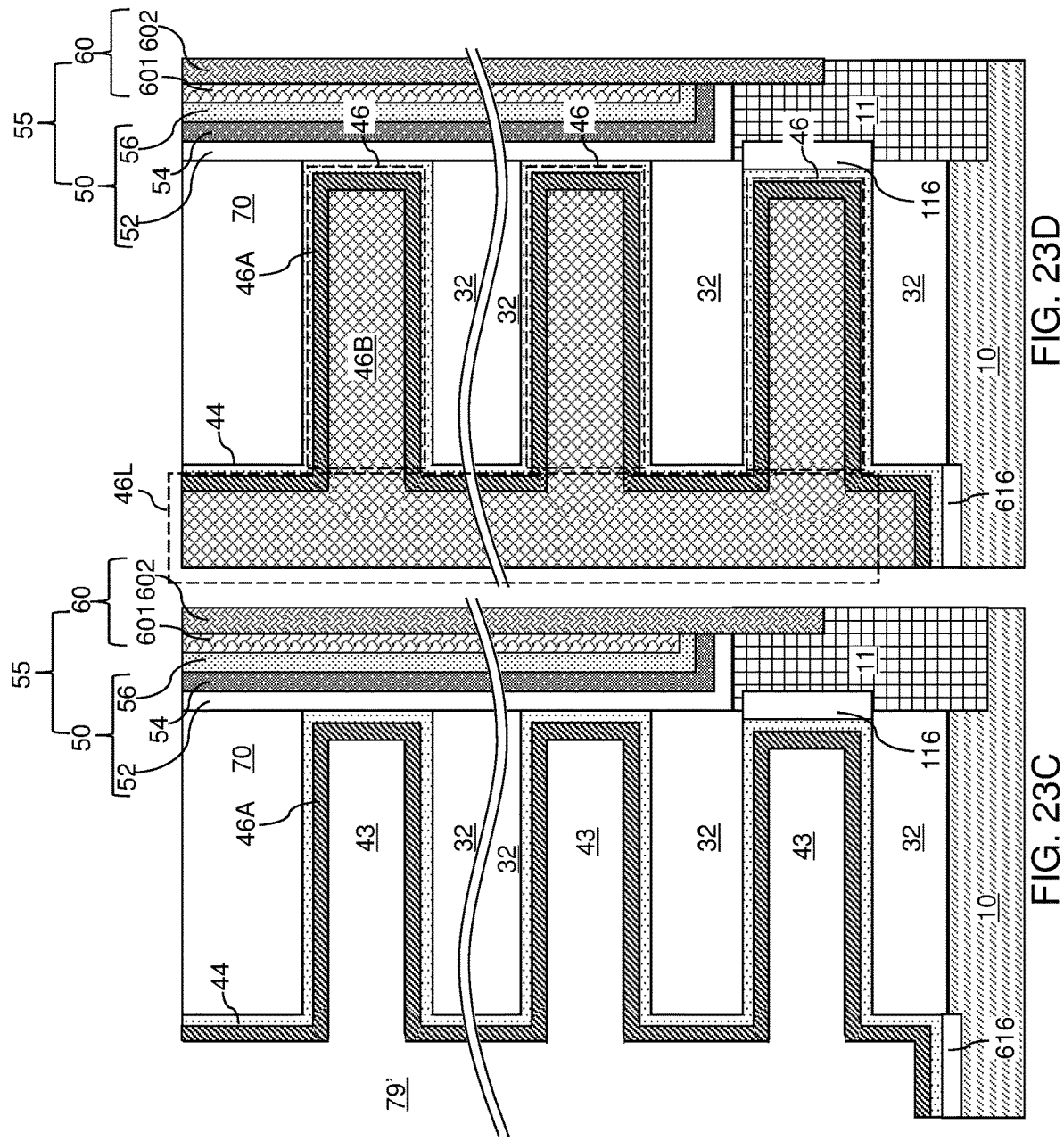

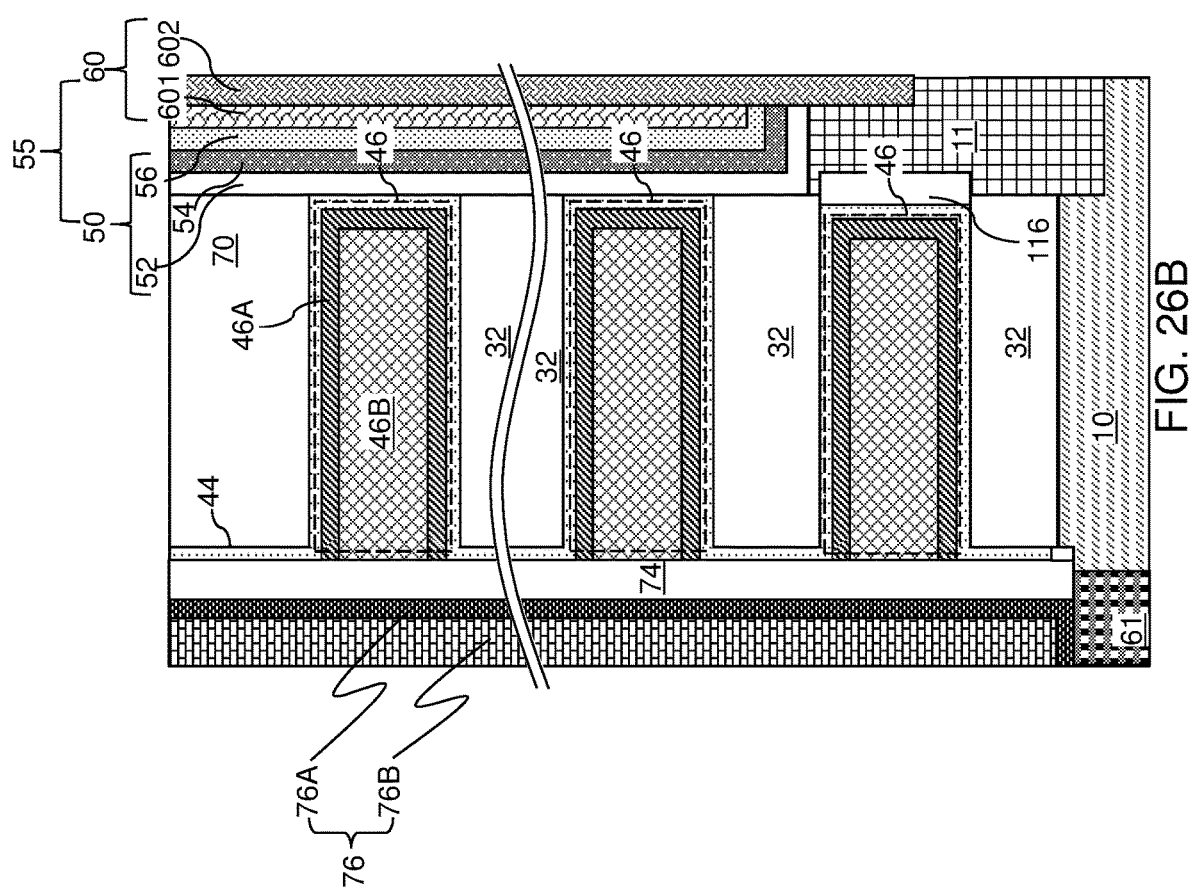

SEMICONDUCTOR DEVICE CONTAINING METAL-ORGANIC FRAMEWORK INTER-LINE INSULATOR STRUCTURES AND METHODS OF MANUFACTURING THE SAME

FIELD

The present disclosure relates generally to the field of semiconductor devices, and particularly to a metal-organic framework inter-line insulator structures in semiconductor devices and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a structure is provided, which comprises: metal line structures located over a substrate and laterally spaced apart from each other, wherein each of the metal line structures comprises a planar metallic liner including a first metal element and a metal line body portion comprising a second metal element that can be different from first metal element; and metal-organic framework (MOF) material portions located between neighboring pairs of the metal line structures and comprising metal ions or clusters of the first metal element and organic ligands connected to the metal ions or clusters of the first metal element.

According to another aspect of the present disclosure, a method of forming a structure is provided, which comprises: forming in-process metal line structures embedded within a sacrificial matrix layer over a substrate, wherein each of the in-process metal line structures comprises a metallic liner layer including a first metal element and a metal line body portion including a second metal element, and wherein the metallic liner layer includes a respective set of a horizontally-extending bottom portion and a pair of vertically-extending portions adjoined to a respective edge of the horizontally-extending bottom portion; physically exposing sidewalls of the vertically-extending portions of the metallic liner layers by removing the sacrificial matrix layer, wherein the vertically-extending portions either comprise metal oxide precursor portions or are converted by oxidation to the metal oxide precursor portions; and forming metal-organic framework (MOF) material portions between neighboring pairs of metal line body portions by reacting the metal oxide precursor portions with a vapor of a linking compound.

BRIEF DESCRIPTION OF THE DRAWINGS

FIG. 1A is a schematic top-down view of a first exemplary structure after formation of a device structure, a first via-level dielectric layer, and first conductive via structures extending through the contact-level dielectric layer according to an embodiment of the present disclosure.

FIG. 1B is a schematic vertical cross-sectional view of the first exemplary structure along the plane B-B' of FIG. 1A.

FIG. 2A is a schematic top-down view of the first exemplary structure after formation of a sacrificial matrix layer according to an embodiment of the present disclosure.

FIG. 2B is a schematic vertical cross-sectional view of the first exemplary structure along the plane B-B' of FIG. 2A.

FIG. 4A is a schematic top-down view of the first exemplary structure after formation of a continuous metallic liner layer including a first metal element according to an embodiment of the present disclosure.

FIG. 4B is a schematic vertical cross-sectional view of the first exemplary structure along the plane B-B' of FIG. 5A.

FIG. 7A is a schematic top-down view of the first exemplary structure after removal of the sacrificial matrix layer according to an embodiment of the present disclosure.

FIG. 7B is a schematic vertical cross-sectional view of the first exemplary structure along the plane B-B' of FIG. 7A.

FIG. 12A is a schematic top-down view of an alternative configuration of the first exemplary structure after formation of metal-oxide framework (MOF) material portions according to an embodiment of the present disclosure.

FIG. 12B is a schematic vertical cross-sectional view of the alternative configuration of the first exemplary structure along the plane B-B' of FIG. 12A.

FIGS. 19A-19H are sequential schematic vertical cross-sectional views of a memory opening within the second exemplary structure during formation of a memory stack structure, an optional dielectric core, and a drain region therein according to an embodiment of the present disclosure.

FIGS. 23A-23D are sequential vertical cross-sectional views of a region of the second exemplary structure during formation of electrically conductive layers according to an embodiment of the present disclosure.

FIG. 26B is a magnified view of a region of the second exemplary structure of FIG. 26A.

DETAILED DESCRIPTION

Figure 3B:
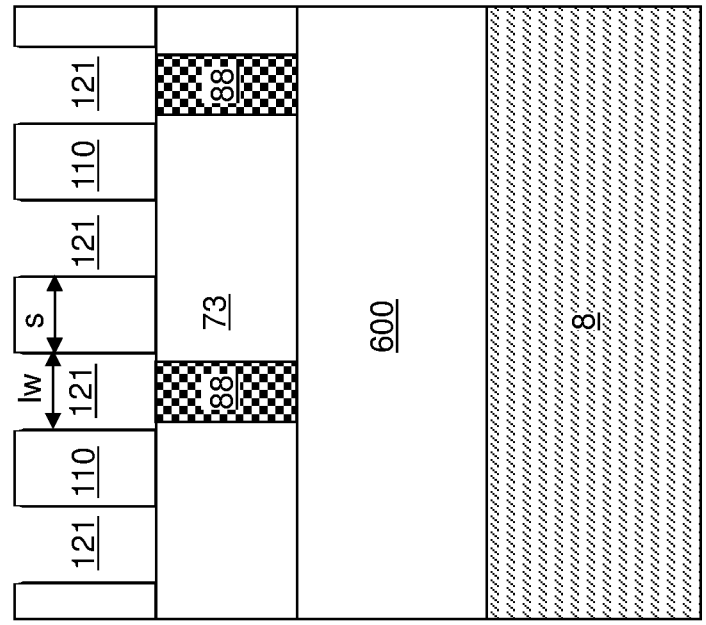
FIG. 3B is a schematic vertical cross-sectional view of the first exemplary structure along the plane B-B' of FIG. 3A.

As discussed above, the present disclosure is directed to a metal-organic framework inter-line insulator structures and methods of manufacturing the same, the various aspects of which are described below. The embodiments of the disclosure can be employed to form various device structures, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process"

structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m.

As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metal element therein. All measurements for electrical conductivities are made at the standard condition.

Referring to FIGS. 1A and 1B, a first exemplary structure according to an embodiment of the present disclosure is illustrated, which includes a substrate 8 and a device structure 600 formed over the substrate 8. The device structure 600 includes at least one semiconductor device such as field effect transistors, a three-dimensional array of memory elements, or any other semiconductor device known in the art. The device structure 600 may include at least one dielectric material layer at an upper portion thereof, and may include a plurality of electrically active nodes therein. The electrically active nodes of the device structure 600 may, or may not, be arranged in a periodic pattern. In one embodiment, the device structure 600 may include a memory array such as a three-dimensional array of memory elements including a two-dimensional array of memory stack structures within which memory elements are vertically stacked, as will be described below with respect to FIGS. 15 to 28. In such cases, the electrically active nodes within the device structure 600 can include drain regions connected to a top end of a respective vertical semiconductor channel in a respective memory stack structure. The device structure 600 may have a planar top surface that is parallel to the top surface of the substrate 8.

A dielectric material layer may be deposited over the top surface of the device structure 600. In one embodiment, conductive via structures may be subsequently formed through the dielectric material layer. In this case, the dielectric material layer is herein referred to as a first via-level dielectric layer 73. The first via-level dielectric layer 73 includes a dielectric material such as silicon nitride, undoped silicate glass (e.g., silicon oxide), a doped silicate glass, or organosilicate glass. The thickness of the first via-level dielectric layer 73 can be in a range from 100 nm to 600 nm, although lesser and greater thicknesses can also be employed.

Via cavities can be formed through the first via-level dielectric layer 73. For example, a photoresist layer can be applied over the top surface of the first via-level dielectric layer 73, and can be lithographically patterned to form discrete openings that overlie the electrically active nodes within the device structure 600. An anisotropic etch process can be performed to form via cavities underneath the discrete openings in the patterned photoresist layer. The photoresist layer can be removed, for example, by ashing.

At least one conductive material can be subsequently deposited in the via cavities. The at least one conductive material can include, for example, a metallic liner material such as TiN, TaN, or WN, or a metallic fill material such as W, Cu, Mo, Ru, Co, Al, another elemental metal, or an intermetallic alloy. Excess portions of the at least one conductive material can be removed from above the horizontal plane including the top surface of the first via-level dielectric layer 73 by a planarization process. The planarization process can include a recess etch process and/or a chemical mechanical planarization process. Each remaining portion of the at least one conductive material comprises a conductive via structure, which is herein referred to as a first conductive via structure 88. In one embodiment, the first conductive via structures 88 can be arranged in rows that laterally extend along a first horizontal direction hd1. The rows can be laterally spaced apart along a second horizontal direction hd2 that is perpendicular to the first horizontal direction hd1.

Referring to FIGS. 2A and 2B, a sacrificial matrix layer 110 can be deposited over the first via-level dielectric layer 73. The sacrificial matrix layer 110 includes a sacrificial material that can be subsequently removed selective to the materials of the first via-level dielectric layer 73 and the first conductive via structures 88. For example, the sacrificial matrix layer 110 may include silicon nitride, a semiconductor material (such as amorphous silicon, polysilicon, or a silicon-germanium alloy), undoped silicate glass (e.g., silicon oxide from a TEOS source in case the first via-level dielectric layer 73 includes silicon nitride), organosilicate glass or borosilicate glass (in case the first via-level dielectric layer 73 includes undoped silicate glass or silicon nitride), or a polymer material. The sacrificial matrix layer 110 can be deposited by a conformal or a non-conformal deposition process. The thickness of the sacrificial matrix layer 110 can be in a range from 100 nm to 600 nm, although lesser and greater thicknesses can also be employed.

Figure 3A:
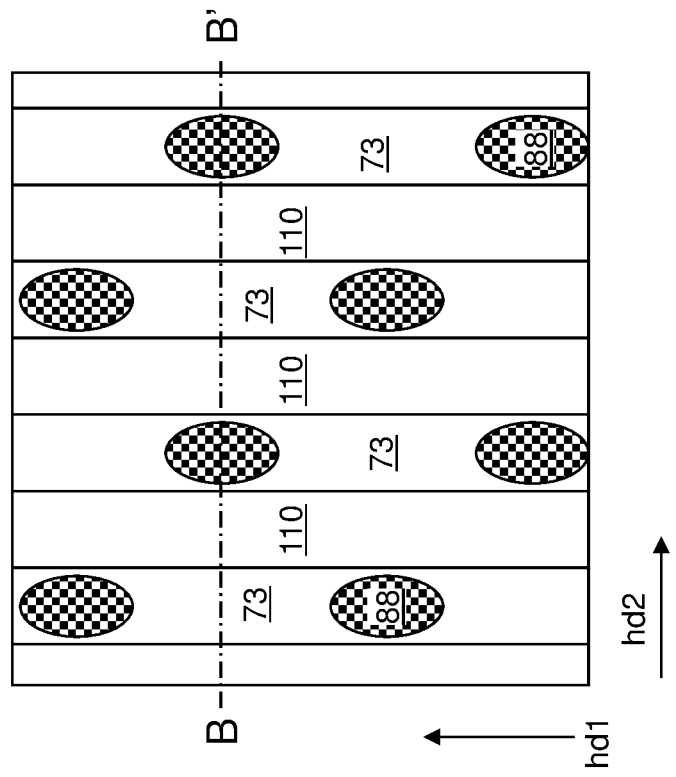
FIG. 3A is a schematic top-down view of the first exemplary structure after formation of line cavities according to an embodiment of the present disclosure.

Referring to FIGS. 3A and 3B, a photoresist layer (not shown) can be applied over the top surface of the sacrificial matrix layer 110, and can be lithographically patterned to form line-shaped openings having a respective uniform width. In one embodiment, the line-shaped openings may laterally extend along a common horizontal direction. For example, the line-shaped openings may laterally extend along the first horizontal direction hd1, which is the horizontal direction along which the first conductive via structures 88 within a same row are arranged. In one embodiment, the rows of the first conductive via structures 88 can be arranged with a uniform pitch. In one embodiment, the line-shaped openings can be arranged with the same uniform pitch as the rows of first conductive via structures 88. In this case, the pattern of the line-shaped openings in the photoresist layer may be a one-dimensional periodic pattern that is repeated along the second horizontal direction hd1 with a periodicity that is the same as the uniform pitch.

An anisotropic etch process can be performed employing the patterned photoresist layer as an etch mask layer. The pattern in the photoresist layer can be transferred through the sacrificial matrix layer 110 to form line trenches 121 having a respective uniform line width 1$w$. A top surface of at least one first conductive via structure 88 can be physically exposed at the bottom of each line trench 121. Neighboring pairs of line trenches 121 may be laterally spaced from each other by a uniform spacing s. The uniform line width 1$w$ may be in a range from 20 nm to 200 nm, such as from 40 nm to 100 nm. The uniform spacing s may be in a range from 20 nm to 200 nm, such as from 40 nm to 100 nm.

Referring to FIGS. 4A and 4B, a continuous metallic liner layer 136L can be formed by depositing a conductive metallic material including a first metal element. The first metal element is an element in a Periodic Table of Elements from which a metal-organic framework (MOF) material can be generated.

Metal-organic frameworks (MOF's) are porous crystalline materials that are formed by linking inorganic and organic units with strong bonds in a structure that forms a cavity having dimensions greater than the size of an individual atom. MOF's can be coordination polymers that include metal ions or clusters that are coordinated to organic ligands to form a porous three-dimensional structure. Each metal ion or cluster is connected to at least a bidentate organic ligand (i.e., two or more ligands). The organic ligands form a coordination network containing voids around the metal ions or clusters. Over 20,000 different types of MOFs have been reported. MOFs are dielectric materials and typically have a low dielectric constant, which may be in a range from 1.7 to 2.6.

Methods for forming MOF's have been disclosed in recently published articles such as M. Krishtab et al., *Vapor-deposited zeolitic imidazolate frameworks as gap-filling ultra-low-k dielectrics*, Nature Communications, 10:3729 (2019); T. Stassin, *Vapour-phase deposition of oriented copper dicarboxylate metal-organic framework thin films*, Chem Commun, 2019 Sep. 4; 55(68):10056-10059; and E. Perez, *Origins and Evolution of Inorganic-Based and MOF-Based Mixed-Matrix Membranes for Gas Separations*, Processes 4(3):32, September 2016, the entire contents of which are incorporated herein by reference. In such methods, a metal-containing precursor material is deposited and is subsequently converted into a MOF material upon reaction with a linker precursor vapor.

The continuous metallic liner layer 136L includes a metal-containing precursor material that can be converted into a MOF material upon subsequently reaction with a suitable linker vapor. For example, the continuous metallic liner layer 136L can include, and/or can consist essentially of, an elemental metal, a conductive metal oxide material, a conductive metal nitride material, or a conductive metal carbide material. In case the continuous metallic liner layer 136L includes an elemental metal, the continuous metallic liner layer 136L can include, and/or can consist essentially of, titanium, molybdenum, copper, cobalt, zirconium, zinc, manganese, or ruthenium. In case the continuous metallic liner layer 136L includes a metal oxide material, the continuous metallic liner layer 136L can include, and/or can consist essentially of, molybdenum oxide, zinc oxide, manganese carbide, or ruthenium oxide. In case the continuous metallic liner layer 136L includes a metal nitride material, the continuous metallic liner layer 136L can include, and/or can consist essentially of, titanium nitride, molybdenum nitride, copper nitride, cobalt nitride, zirconium nitride, zinc nitride, manganese nitride, or ruthenium nitride. In case the continuous metallic liner layer 136L includes a metal carbide material, the continuous metallic liner layer 136L can include, and/or can consist essentially of, titanium carbide, molybdenum carbide, copper carbide, cobalt carbide, zirconium carbide, zinc carbide, manganese carbide, or ruthenium carbide.

The continuous metallic liner layer 136L may be deposited by a conformal deposition process or a non-conformal deposition process. In one embodiment, the continuous metallic liner layer 136L may be deposited by a conformal deposition process. The average thickness of vertical portions of the continuous metallic liner layer 136L can be in a range from 0.5 nm to 40 nm, such as from 1 nm to 20 nm. In one embodiment, the thickness of the continuous metallic liner layer 136L can be selected to subsequently generate enough MOF material that fills the entire volume of line cavities to be subsequently formed by removal of the sacrificial matrix layer 110. In another embodiment, the thickness of the continuous metallic liner layer 136L can be selected to subsequently generate an amount of a MOF material that is insufficient to fill the entire volume of line cavities to be subsequently formed by removal of the sacrificial matrix layer 110. The continuous metallic liner layer 136L can continuously extend into each of the line trenches 121 and over the top surfaces of remaining portions of the sacrificial matrix layer 110, which include rail structures that extend along the first horizontal direction hd1.

Figure 5B:
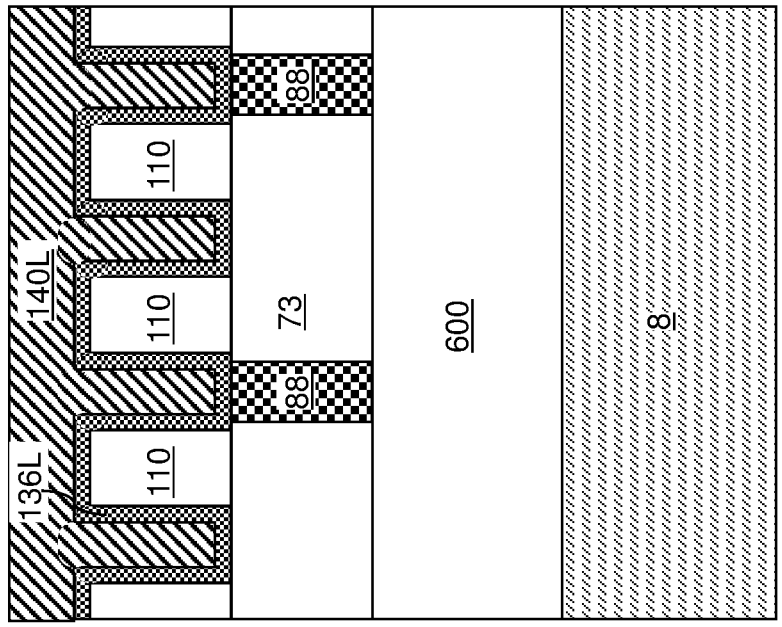
FIG. 5B is a schematic vertical cross-sectional view of the first exemplary structure along the plane B-B' of FIG. 5A.
Figure 5A:
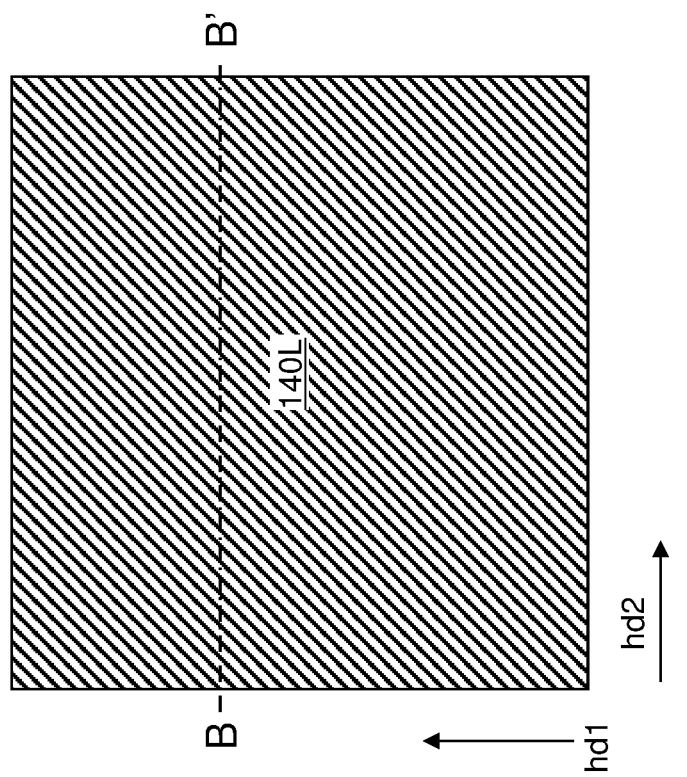
FIG. 5A is a schematic top-down view of the first exemplary structure after formation of a continuous metallic fill material layer including a second metal element according to an embodiment of the present disclosure.

Referring to FIGS. 5A and 5B, a metallic fill material including a second elemental metal is deposited in unfilled volumes of the line trenches 121 to form a metallic fill material layer 140L. The metallic fill material layer 140L can fill the entirety of remaining volumes of the line trenches 121, and continuously extends over the remaining portions of the sacrificial matrix layer 110. A conformal deposition process (such as a chemical vapor deposition process) or a superconformal deposition process (such as electroplating employing superconformal deposition conditions) may be employed. Optionally, a seed layer may be deposited employing a non-conformal deposition process (such as physical vapor deposition). The second elemental metal is different from the first elemental metal of the continuous metallic liner layer 136. The second elemental metal is selected such that the second elemental metal does not react with a specific organic linker to be subsequently employed to induce formation of a MOF material from the material of the continuous metallic liner layer 136.

In an illustrative example, if the continuous metallic liner layer 136L includes titanium, molybdenum, cobalt, zirconium, zinc, manganese, or ruthenium, the metallic fill material layer 140L can include, and/or can consist essentially of, copper or a copper-containing alloy in which the atomic concentration of copper is greater than 50%. If the continuous metallic liner layer 136L includes titanium, molybdenum, copper, cobalt, zirconium, zinc, manganese, or ruthenium, the metallic fill material layer 140L can include, and/or can consist essentially of, tungsten, aluminum, silver, gold, palladium, or platinum.

Figure 6B:
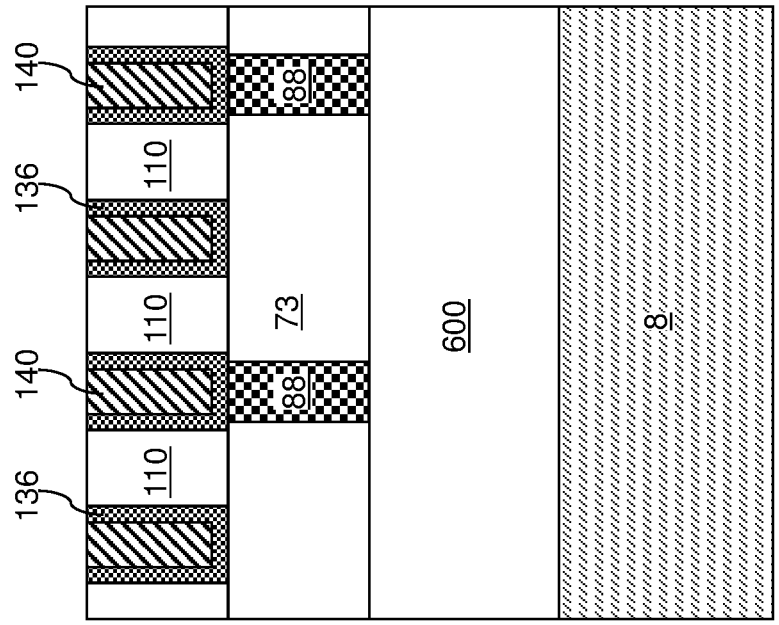
FIG. 6B is a schematic vertical cross-sectional view of the first exemplary structure along the plane B-B' of FIG. 6A.
Figure 6A:
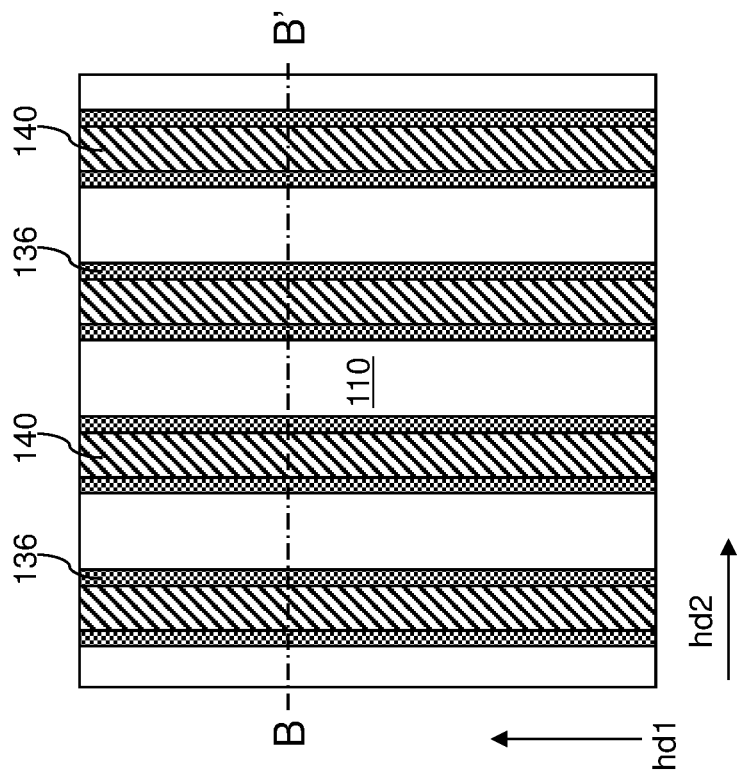
FIG. 6A is a schematic top-down view of the first exemplary structure after formation of in-process metal line structures according to an embodiment of the present disclosure.

Referring to FIGS. 6A and 6B, a planarization process can be performed to remove portions of the metallic fill material layer 140L and the continuous metallic liner layer 136L from above the horizontal plane including the top surface of the sacrificial matrix layer 110. A chemical mechanical planarization (CMP) process and/or a recess etch process (which may include a dry etch and/or a wet etch) may be employed. The sacrificial matrix layer 110 may be employed as a polishing stop layer and/or as an etch stop layer during the planarization process.

Each contiguous combination of the remaining portions of the metallic fill material layer 140L and the continuous metallic liner layer 136L located within a respective one of the line trenches 121 constitutes a metal line structure, which is subsequently modified, and is herein referred to as an in-process metal line structure (136, 140). Each in-process metal line structure (136, 140) can include a metallic liner layer 136 and a metal line body portion 140. Each metallic liner layer 136 is a patterned portion of the continuous metallic liner layer 136L. Each metal line body portion 140 is a patterned portion of the metallic fill material layer 140L. The in-process metal line structures (136, 140) are electrically conductive and are embedded within the sacrificial matrix layer 110, and are located over the substrate 8.

Each of the in-process metal line structures (136, 140) comprises a metallic liner layer 136 including a first metal element and a metal line body portion 140 including a second metal element. The first metal element in the metallic liner layer 136 can be in an elemental form, or in the form of a metal oxide, a metal nitride, or a metal carbide. The second metal element in the metal line body portion 140 can be in an elemental form, or may be within an intermetallic alloy with at least another metal element. Each metallic liner layer 136 includes a respective set of a horizontally-extending bottom portion and a pair of vertically-extending portions adjoined to a respective edge of the horizontally-extending bottom portion. In other words, each metallic liner layer 136 can have a U-shaped vertical cross-sectional profile in vertical planes that are perpendicular to the first horizontal direction hd1. The sidewalls of the in-process metal line structures (136, 140) are straight, and may be vertical or may have a taper angle greater than 0 degree and less than 10 degrees, such as a taper angle in a range from 0.5 degree to 5 degree, with respect to a vertical direction such that the in-process metal line structures (136, 140) have a greater width at a top portion than at a bottom portion. Each metal line body portion 140 can have a vertical cross-sectional shape of a rectangle or a trapezoid (with a greater width at the top) in vertical planes that are perpendicular to the first horizontal direction hd1. The in-process metal line structures (136, 140) can be arranged as a one-dimensional periodic array having a uniform pitch along the second horizontal direction hd2.

Referring to FIGS. 7A and 7B, the sacrificial matrix layer 110 can be removed selective to the materials of the in-process metal line structures (136, 140) and the first via-level dielectric layer 73. An anisotropic etch process or an isotropic etch process may be employed. For example, a wet etch process that etches the material of the sacrificial matrix layer 110 selective to the materials of the in-process metal line structures (136, 140) and the first via-level dielectric layer 73 may be employed. As used herein, a "selective" etch process is an etch process that etches a first material at an etch rate that is at least three times the etch rate of a second material. The "selectivity" of the etch process is the ratio of the etch rate of the first material to the etch rate of the second material. In one embodiment, the selectivity of the etch process that is employed to etch the sacrificial matrix layer 110 selective to the materials of the in-process metal line structures (136, 140) and the first via-level dielectric layer 73 is greater than 10, and is preferably greater than 30, and is more preferably greater than 100, and is even more preferably greater than 300. For example, the selectivity of the etch process can be in a range from 10 to 10,000.

In an illustrative example, if the sacrificial matrix layer 110 comprises silicon nitride, the wet etch process that can be employed to remove the sacrificial matrix layer 110 can employ hot phosphoric acid. If the sacrificial matrix layer 110 comprises silicon oxide, then a wet or dry etch using hydrofluoric acid liquid or vapor may be used to remove the sacrificial matrix layer 110. If the sacrificial matrix layer 110 comprises amorphous silicon, polysilicon, or a silicon-germanium alloy, then a wet etch using hot trimethyl-2 hydroxyethyl ammonium hydroxide ("hot TMY") or tetramethyl ammonium hydroxide (TMAH) may be used to remove the sacrificial matrix layer 110. Outer sidewalls of the metallic liner layers 136 and the top surface of the first via-level dielectric layer 73 are physically exposed after the etch process that removes the sacrificial matrix layer 110. In other words, sidewalls of the vertically-extending portions of the metallic liner layers 136 are physically exposed by removing the sacrificial matrix layer 110. A line cavity 111 that laterally extends along the first horizontal direction hd1 can be formed in each volume from which a laterally-extending portion of the sacrificial matrix layer 110 is removed. Each neighboring pair of in-process metal line structures (136, 140) with the one-dimensional periodic array of the in-process metal line structures (136, 140) is laterally spaced from each other along the second horizontal direction hd2 by a respective one of the line cavities 111.

While the present disclosure is described employing an embodiment in which the in-process metal line structures (136, 140) are arranged as a one-dimensional periodic array, embodiments are expressly contemplated herein in which the lateral spacing between the in-process metal line structures (136, 140) is not periodic. Further, embodiments are expressly contemplated herein in which the lengthwise directions of the in-process metal line structures (136, 140) are not the same, and different in-process metal line structures (136, 140) have different lateral extension directions. In addition, embodiments are expressly contemplated herein in which at least one of the in-process metal line structures (136, 140) have bends, bifurcations, or other direction-changing features to provide a non-linear lateral extension pattern. The methods of embodiments of the present disclosure are applicable whenever line cavities 111 can be formed between a neighboring pair of in-process metal line structures (136, 140) with a uniform or non-uniform spacing through removal of a portion of a sacrificial matrix layer 110.

Figure 8B:
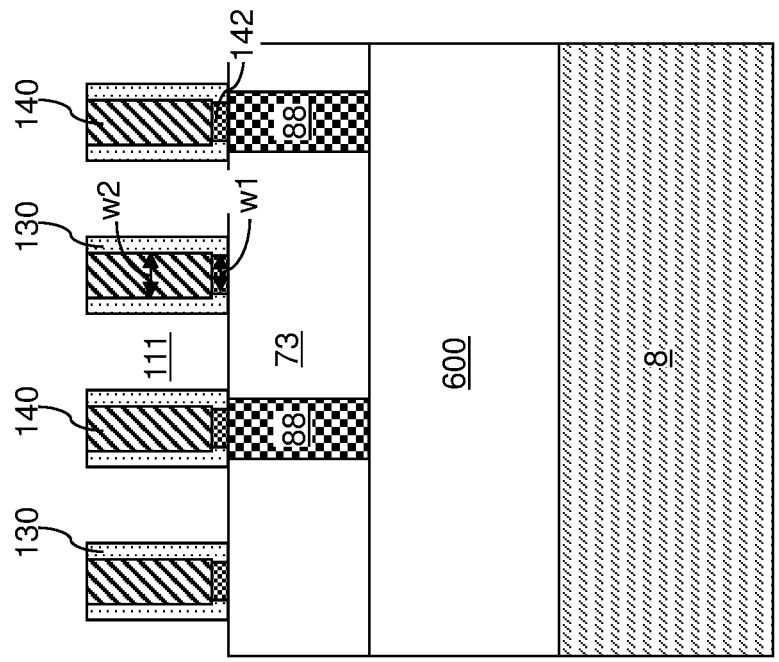
FIG. 8B is a schematic vertical cross-sectional view of the first exemplary structure along the plane B-B' of FIG. 8A.
Figure 8A:
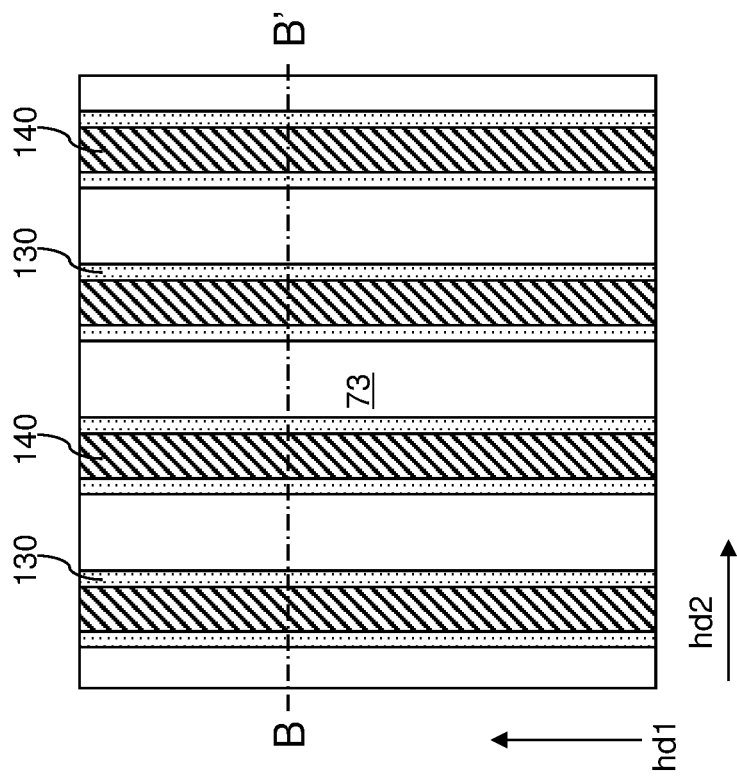
FIG. 8A is a schematic top-down view of the first exemplary structure after conversion of vertically-extending portions of metallic liner layers into metal oxide precursor portions by an oxidation process according to an embodiment of the present disclosure.

Referring to FIGS. 8A and 8B, metal oxide precursor portions 130 are physically exposed in the line cavities 111. In case the continuous metallic liner layer 136L, and thus, the metallic liner layers 136, include a metallic oxide of the first elemental metal (such as titanium, molybdenum, cobalt, zirconium, zinc, manganese, or ruthenium), then the vertically-extending portions of the metallic liner layers constitute the metal oxide precursor portions 130. In case the continuous metallic liner layer 136L, and thus, the metallic liner layers 136, include the first elemental metal (such as titanium, molybdenum, cobalt, zirconium, zinc, manganese, or ruthenium) in an elemental form or in the form of a metallic nitride or a metallic carbide, then an oxidation process that oxidizes portions of the metallic liner layers 136 exposed in the line cavities 111 can be performed to convert the first elemental metal of the metallic liner layers 136 into an oxide of the first elemental metal. The oxidized portions of the metallic liner layers 136 constitute the metal oxide precursor portions 130. The oxidation process that oxidizes the vertically-extending portions of the metallic liner layers 136 can include a thermal oxidation process or a plasma oxidation process.

Each unoxidized portion of the metallic liner layers 136 located underneath the metal line body portions 140 constitutes a planar metallic liner 142, which includes the same material as the continuous metallic liner layer 136L as formed at the processing steps of FIGS. 4A and 4B. In other words, in case the metal oxide precursor portions 130 are formed by oxidation of vertically-extending portions of the metallic liner layers 136, a segment of each metallic liner layer 136 is not oxidized during the oxidation process, and forms a respective planar metallic liner 142.

In case the metallic liner layers 136 include a metallic oxide of the first elemental metal, then a horizontally-extending portion of each metallic liner layer 136 that underlies a respective one of the metal line body portions 140 constitutes a planar metallic liner 142. In this case, the planar metallic liners 142 and the metal oxide precursor portions 130 can have the same material composition, i.e., the material composition of the oxide of the first metallic material.

The vertically-extending portions of the metallic liner layers 136 can be entirely converted into the metal oxide precursor portions 130. In this case, the metal oxide precursor portions 130 contact sidewalls of the metal line body portions 140. In one embodiment, the oxidation process that forms the metal oxide precursor portions 130 can proceed for a duration that oxidizes the entirety of the vertically-extending portions of the metallic liner layer 136 and further oxidizes edge regions of horizontal segments of the metallic liner layers 136 that is under the metal line body portions 140. In this case, the planar metallic liners 142 can have a respective width that is less than the width of an overlying one of the metal line body portions 140. For example, the planar metallic liners 142 can have a first width w1 after the oxidation process, and the metal line body portions 140 can have a second width w2 such that the second width w2 is greater than the first width w1. In one embodiment, each of the planar metallic liners 142 can have a uniform thickness throughout, which may be in a range from 0.5 nm to 40 nm, such as from 1 nm to 20 nm. Alternatively, if not the entire thickness of the sidewall portions of the metallic liner layers 136 is oxidized, then parts of the metallic liner layers 136 may also be located under the metal oxide precursor portions 130.

Each contiguous combination of a planar metallic liner 142 and a metal line body portion 140 constitutes a metal line structure (142, 140). The metal line structures (142, 140) may be arranged as a one-dimensional periodic array. In one embodiment, each of the metal line structures (142, 140) comprises a planar metallic liner 142 and a metal line body portion 140. In one embodiment, one of the metal line structures (142, 140) comprises a first planar metallic liner 142 of the planar metallic liners 142 and a first metal line body portion 140 of the metal line body portions 140. The first planar metallic liner 142 can have a first width w1, and the first metal line body portion 140 can have a second width w2 (which may be invariant along the vertical direction or may be measured at the bottommost portion of the first metal line body portion 140) that is greater than the first width w1.

In one embodiment, the planar metallic liners 142 can consist essentially of atoms of the first metal element, or can consist essentially of a conductive oxide of the first metal element, a conductive nitride of the first metal element, or a conductive carbide of the first metal element. In one embodiment, the first metal element is one of titanium, molybdenum, copper, cobalt, zirconium, zinc, manganese, or ruthenium. The planar metallic liners 142 provide vertically conductive paths between a respective overlying metal line body portion 140 and each underlying first conductive via structure 88.

Figure 9B:
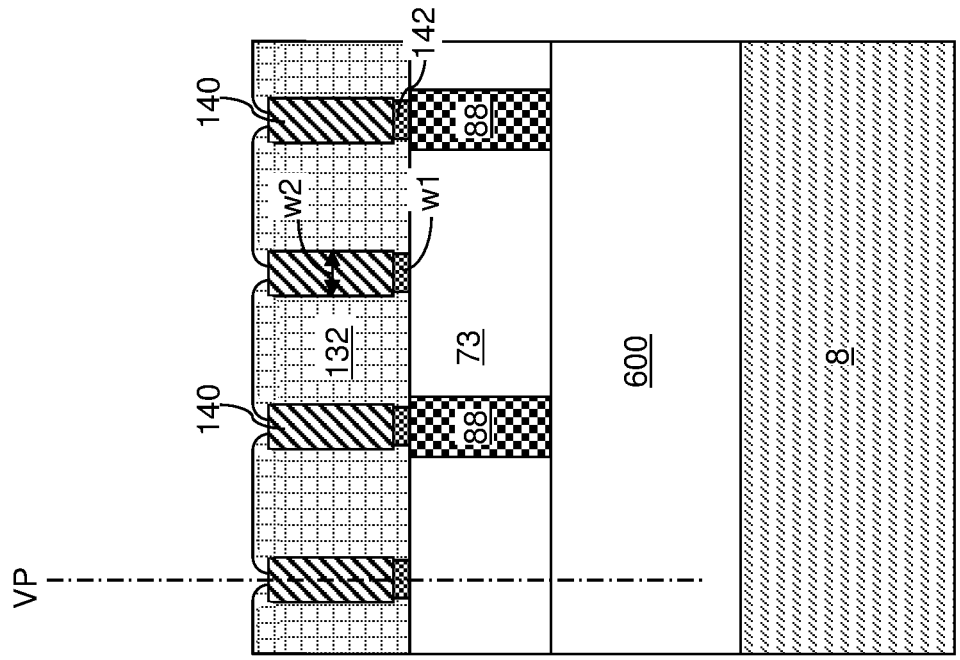
FIG. 9B is a schematic vertical cross-sectional view of the first exemplary structure along the plane B-B' of FIG. 9A.
Figure 9A:
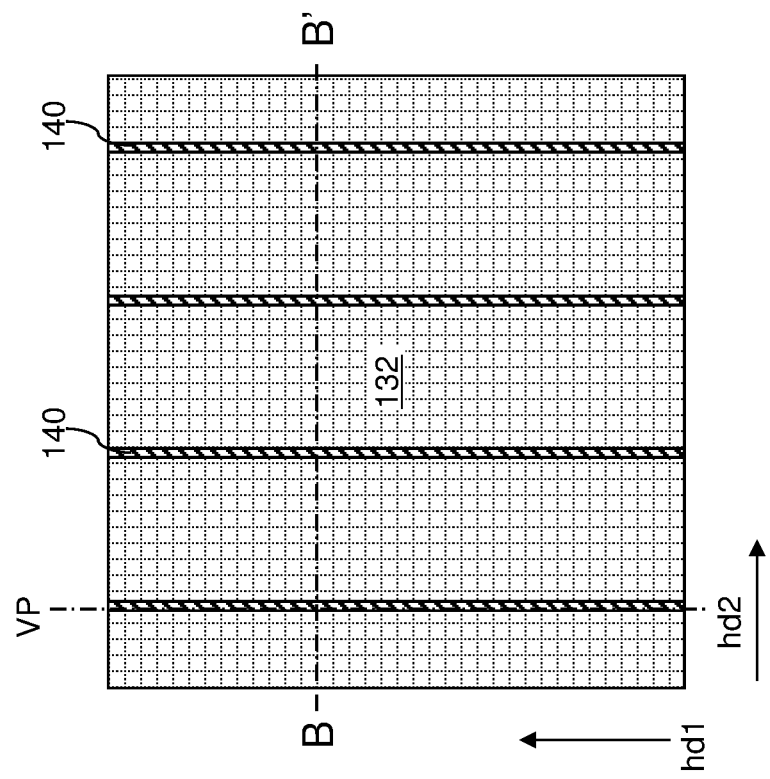
FIG. 9A is a schematic top-down view of the first exemplary structure after formation of metal-oxide framework (MOF) material portions according to an embodiment of the present disclosure.

Referring to FIGS. 9A and 9B, the first exemplary structure is placed in a vacuum-tight reaction chamber. The metal oxide material of the metal oxide precursor portions 130 is exposed to a vapor of a linking compound that forms a metal-organic framework (MOF) material upon reaction. Any combination of a metallic material for the metal oxide precursor portions 130 and the vapor of the linking compound that is known to form a MOF material may be employed. Generally, the molecular species for the vapor of the linking compound can be selected based on the metal oxide material in the metal oxide precursor portions 130.

For example, if the metal oxide precursor portions 130 include zinc (e.g., zinc oxide), then a vapor of 1,4-benzodicarboxylate (e.g., 1,4-benzodicarboxylic acid) can be employed as the organic linker to form MOF-5, which includes $ZnO_4$ nodes and 1,4-benzodicarboxylic acid organic linkers that form the framework that contains large pores between the structure of the framework. In another example, if the metal oxide precursor portions 130 include titanium (e.g., titanium dioxide), then a vapor of 1,4-benzodicarboxylate (e.g., 1,4-benzodicarboxylic acid) can be employed as the organic linker to form MOF MIL-125, which includes titanium containing nodes and 1,4-benzodicarboxylic acid organic linkers that form the framework that contains large pores between the structure of the framework.

Metal-organic framework (MOF) material portions 132 can be formed by reaction of the metal oxide precursor portions 130 and the vapor of the linking compound. The metal oxide precursor portions 130 can be completely consumed during conversion into the MOF material portions 132. Various MOF materials can be formed depending on the composition of the metal oxide precursor portions 130. For example, if the metal oxide precursor portions 130 include titanium, a titanium-based MOF MIL-125 can be formed. If the metal oxide precursor portions 130 include molybdenum, a molybdenum-based MOF TUDMOF-1 can be formed. The composition of the MOF material portions 132 depends on the composition of the metal oxide precursor portions 130 and the composition of the linking compound.

The MOF material portions 132 are formed by reacting the metal oxide precursor portions 130 with the vapor of the linking compound. The MOF material portions 132 are insulating material portions formed in the line cavities 111. The MOF material portions 132 comprise metal ions or clusters connected by at least bidentate organic ligands. In one embodiment, the MOF material portions 132 can fill the entirety of each line cavity 111. In one embodiment, the thickness of the metal oxide precursor portions 130 as formed at the processing steps of FIGS. 8A and 8B can be selected such that a vertically-extending void may be present within one or more of the line cavities 111 after formation of the MOF material portions 132.

Generally, the MOF material portions 132 can be formed between neighboring pairs of metal line body portions 140 by reacting the metal oxide precursor portions 130 with a vapor of a linking compound. The MOF material portions 132 comprise metal ions or clusters of the first metal element and organic ligands connected to the metal ions or clusters of the first metal element. In one embodiment, each metal line structure (142, 140) can have a symmetric profile around a vertical plane VP extending along the first horizontal direction hd1 and is equidistant from the sidewalls of the metal line structure (142, 140) that laterally extend along the first horizontal direction hd1. In one embodiment, a lateral offset distance between a sidewall of the planar metallic liner 142 and a sidewall of an overlying metal line body portion 140 can be one half of the difference between the second width w2 and the first width w1. The planar metallic liners 142 can contact a pair of MOF material portions 132.

In one embodiment, the MOF material portions 132 may grow out of the volumes of the line cavities 111 and protrude above the horizontal plane including the top surfaces of the metal line structures (142, 140). In one embodiment, the topmost regions of the MOF material portions 132 may overlie the top surfaces of the metal line structures (142, 140). In this case, top surfaces of the metal line structures (142, 140) may be partially or entirely covered with the MOF material portions 132. In one embodiment, the MOF material portions 132 may be removed from the top surfaces of the metal line structures (142, 140) by CMP.

Figure 10B:
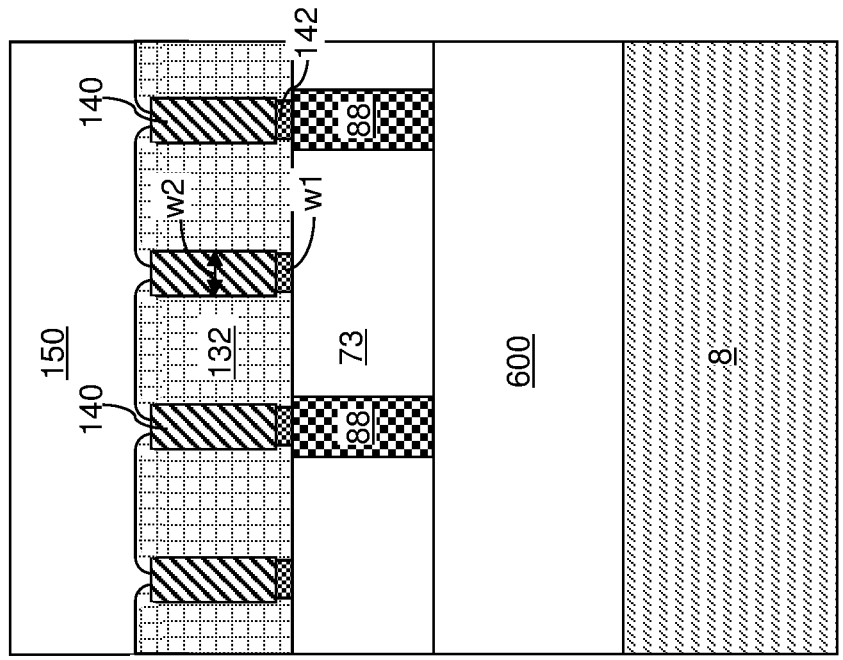
FIG. 10B is a schematic vertical cross-sectional view of the first exemplary structure along the plane B-B' of FIG. 10A.
Figure 10A:
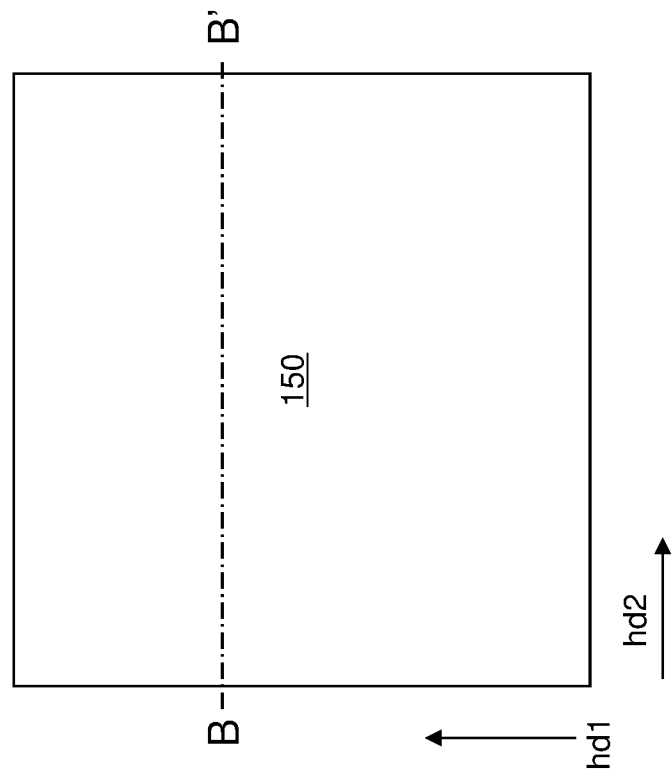
FIG. 10A is a schematic top-down view of the first exemplary structure after formation of a second via-level dielectric layer according to an embodiment of the present disclosure.

Referring to FIGS. 10A and 10B, a second via-level dielectric layer 150 may be formed over a laterally alternating sequence of metal line structures (142, 140) and MOF material portions 132. The second via-level dielectric layer 150 includes a dielectric material such as undoped silicate glass, a doped silicate glass, and organosilicate glass. Optionally, a dielectric liner such as a silicon oxynitride liner or a nitrogen-doped organosilicate glass liner may be formed as a bottommost sublayer, as an interlayer, or as a topmost layer within the second via-level dielectric layer 150. The second via-level dielectric layer 150 can be deposited by a conformal or non-conformal deposition process, and may have a thickness in a range from 100 nm to 600 nm, although lesser and greater thicknesses can also be employed.

In one embodiment, a bottommost surface of the second via-level dielectric layer 150 does not contact the first via-level dielectric layer 73, and is vertically spaced from the first via-level dielectric layer 73 by one of the MOF material portions 132. In one embodiment, the entirety of the volume located between a neighboring pair of metal line structures (142, 140) and between the first via-level dielectric layer 73 and the second via-level dielectric layer 150 can be filled with one of the MOF material portions 132. In one embodiment, the entirety of the volume located between a neighboring pair of metal line body portions 140 and between a horizontal plane including bottom surfaces of the planar metallic liners 142 and a horizontal plane including top surfaces of the metal line body portions 140 can be filled with one of the MOF material portions 132.

Figure 11B:
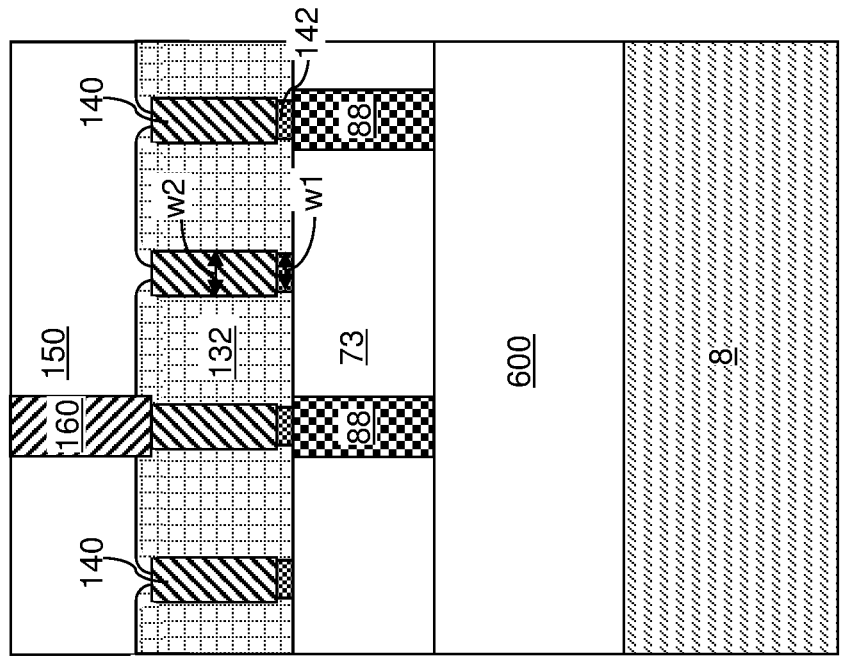
FIG. 11B is a schematic vertical cross-sectional view of the first exemplary structure along the plane B-B' of FIG. 11A.
Figure 11A:
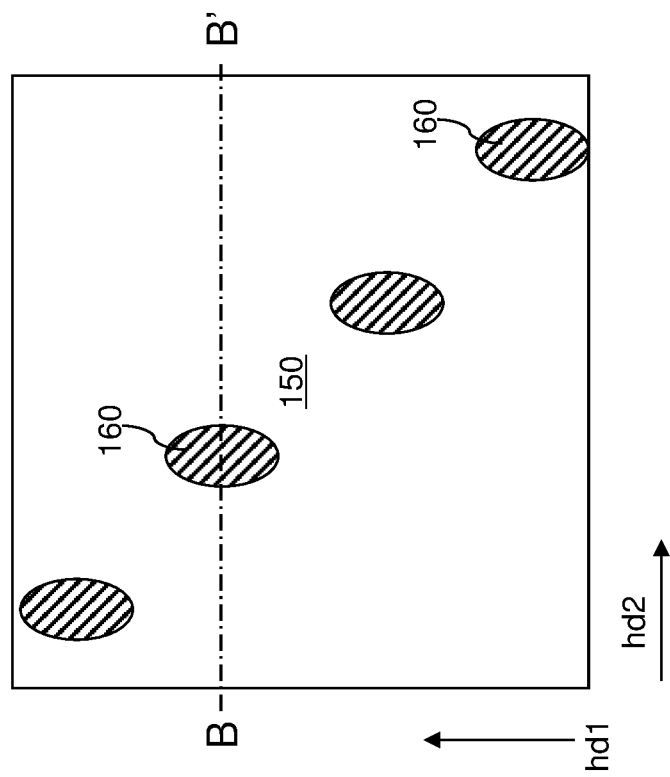
FIG. 11A is a schematic top-down view of the first exemplary structure after formation of second conductive via structures according to an embodiment of the present disclosure.

Referring to FIGS. 11A and 11B, via cavities can be formed through the second via-level dielectric layer 150. For example, a photoresist layer can be applied over the top surface of the second via-level dielectric layer 150, and can be lithographically patterned to form discrete openings that overlie a respective one of the metal line structures (142, 140). An anisotropic etch process can be performed to form via cavities underneath the discrete openings in the patterned photoresist layer. The photoresist layer can be removed, for example, by ashing.

At least one conductive material can be subsequently deposited in the via cavities. The at least one conductive material can include, for example, a metallic liner material such as TiN, TaN, or WN, or a metallic fill material such as W, Cu, Mo, Ru, Co, Al, another elemental metal, or an intermetallic alloy. Excess portions of the at least one conductive material can be removed from above the horizontal plane including the top surface of the second via-level dielectric layer 150 by a planarization process. The planarization process can include a recess etch process and/or a chemical mechanical planarization process. Each remaining portion of the at least one conductive material comprises a conductive via structure, which is herein referred to as a second conductive via structure 160. The second conductive via structures 160 can be formed on a respective one of the metal line structures (142, 140). A second conductive via structure 160 may, or may not, contact a MOF material portion 132 and/or a pair of MOF material portions 132 depending on the lateral extent of the MOF material portions 132 over the top surfaces of the metal line structures (142, 140).

Referring to FIGS. 12A and 12B, an alternative configuration of the first exemplary structure can be derived from the first exemplary structure of FIGS. 8A and 8B by selecting the lateral thickness of each metal oxide precursor portion 130 to be insufficient to generate enough MOF material for filling the entire volume of each line cavity 111. In other words, if the thickness of each metal oxide precursor portion 130 is thin enough, the MOF material generated from the metal oxide precursor portions 130 is insufficient to fill the entire volume of each line cavity 111. In this case, the thickness of each metal oxide precursor portion 130 may be in a range from 0.2% to 20%, such as from 1% to 5%, of the width of each line cavity 111. For example, the thickness of each metal oxide precursor portion 130 may be in a range from 0.5 nm to 20 nm, such as from 1 nm to 5 nm.

The MOF material portions 132 may have a uniform width on the sidewall of a respective one of the metal line structures (142, 140). The uniform width of each MOF material portion 132 can be less than one half of the width of an adjacent line cavity 111. In one embodiment, the MOF material portions 132 may protrude above the horizontal plane including the top surfaces of the metal line structures (142, 140), and may contact edge portions, and/or the entirety of, the top surfaces of the metal line body portions 140. A void can be present between each neighboring pair of MOF material portions 132 located on a neighboring pair of metal line body portions 140. The thickness of each MOF material portion 132 may be in a range from 3% to 48%, such as from 6% to 24%, of the spacing between a neighboring pair of metal line structures (142, 140). A gap can be present between a neighboring pair of MOF material portions 132 that are formed between a neighboring pair of metal line body portions 140.

Figure 13B:
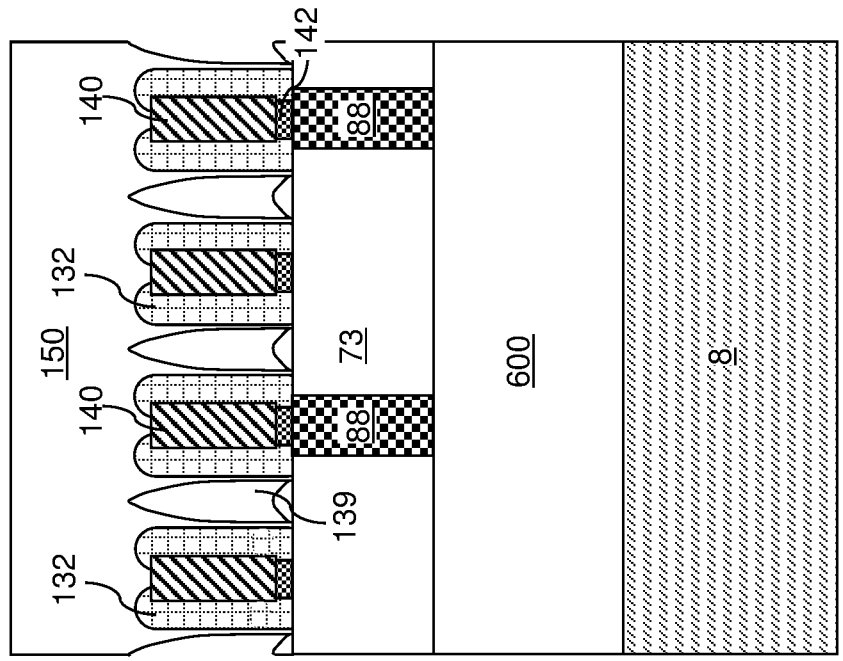
FIG. 13B is a schematic vertical cross-sectional view of the alternative configuration of the first exemplary structure along the plane B-B' of FIG. 10A.
Figure 13A:
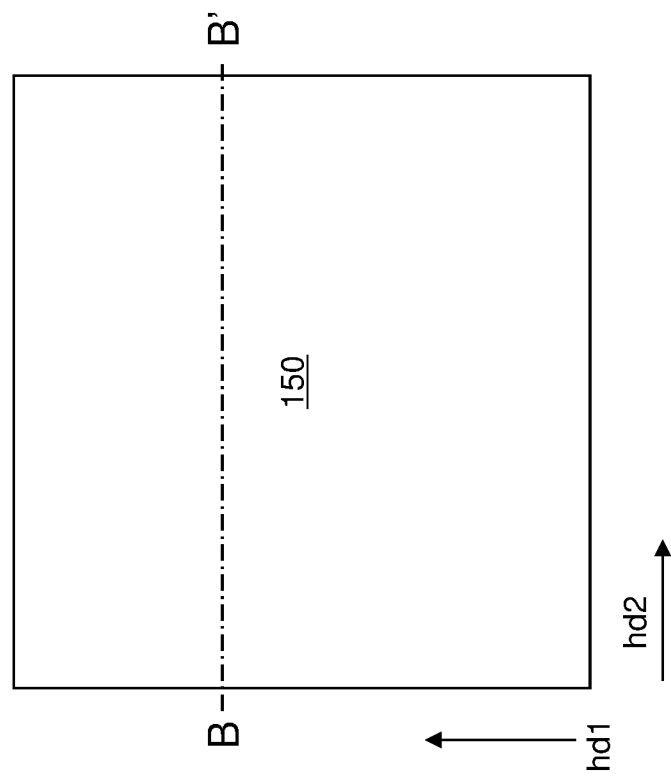
FIG. 13A is a schematic top-down view of the alternative configuration of the first exemplary structure after formation of a second via-level dielectric layer according to an embodiment of the present disclosure.

Referring to FIGS. 13A and 13B, a second via-level dielectric layer 150 may be formed over a laterally alternating sequence of metal line structures (142, 140) and insulating material regions that include a respective pair of MOF material portions 132 and a respective void. The second via-level dielectric layer 150 includes a dielectric material such as undoped silicate glass, a doped silicate glass, and organosilicate glass. Optionally, a dielectric liner such as a silicon oxynitride liner or a nitrogen-doped organosilicate glass liner may be formed as a bottommost sublayer, as an interlayer, or as a topmost layer within the second via-level dielectric layer 150.

According to an aspect of the present disclosure, the second via-level dielectric layer 150 can be deposited by a non-conformal deposition process such as a plasma-enhanced chemical vapor deposition (PECVD) process. The second via-level dielectric layer 150 may have a thickness in a range from 100 nm to 600 nm, although lesser and greater thicknesses can also be employed. The dielectric material of the second via-level dielectric layer 150 can be deposited predominantly on horizontal surfaces that are not shaded by adjacent vertically-extending surfaces such as the vertical surfaces of the MOF material portions 132. Portions of the dielectric material that grow from upper corners of the MOF material portions 132 merge midway above each void between a respective neighboring pair of MOF material portions 132, and form encapsulated voids (i.e., airgaps) 139 that are free of any solid material or any liquid material therein. The airgaps are different from the internal pores between the linkers inside the MOF material portions 132.

In one embodiment, the second via-level dielectric layer 150 comprises downward-protruding portions that contact sidewalls of the MOF material portions 132. The second via-level dielectric layer 150 can contact portions of the top surface of the first via-level dielectric layer 73. Specifically, a pair of downward-protruding portions of the second via-level dielectric layer 150 located between a neighboring pair of MOF material portions 132 can be connected to a horizontal hump portion having a non-uniform thickness. Encapsulated voids 139 that are free of any solid material therein can be located between neighboring pairs of the MOF material portions 132 between the first via-level dielectric layer 73 and the second via-level dielectric layer 150. Generally, a dielectric material layer (such as the second via-level dielectric layer 150) can be formed over the MOF material portions 132 and the metal line body portions 140 employing a non-conformal deposition process such that the dielectric material layer fills the gap with an encapsulated void 139 that occupies a fraction of a volume of the gap.

In one embodiment, a fraction of the volume located between a neighboring pair of metal line structures (142, 140) can be filled with two MOF material portions 132, and another fraction of the volume located between the neighboring pair of metal line structures (142, 140) can be filled with portions of the second via-level dielectric layer 150 and an encapsulated void 139.

Figure 14B:
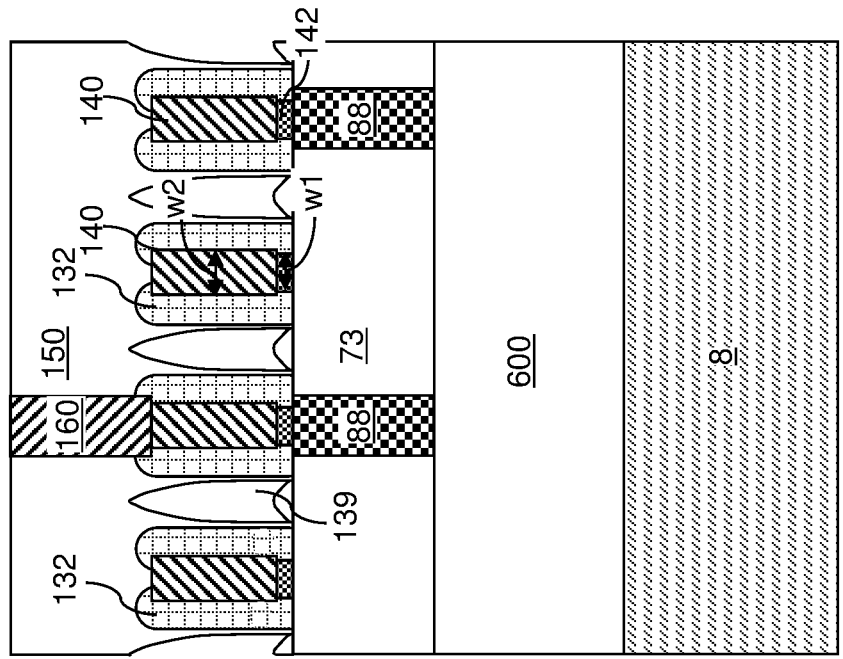
FIG. 14B is a schematic vertical cross-sectional view of the first exemplary structure along the plane B-B' of FIG. 14A.
Figure 14A:
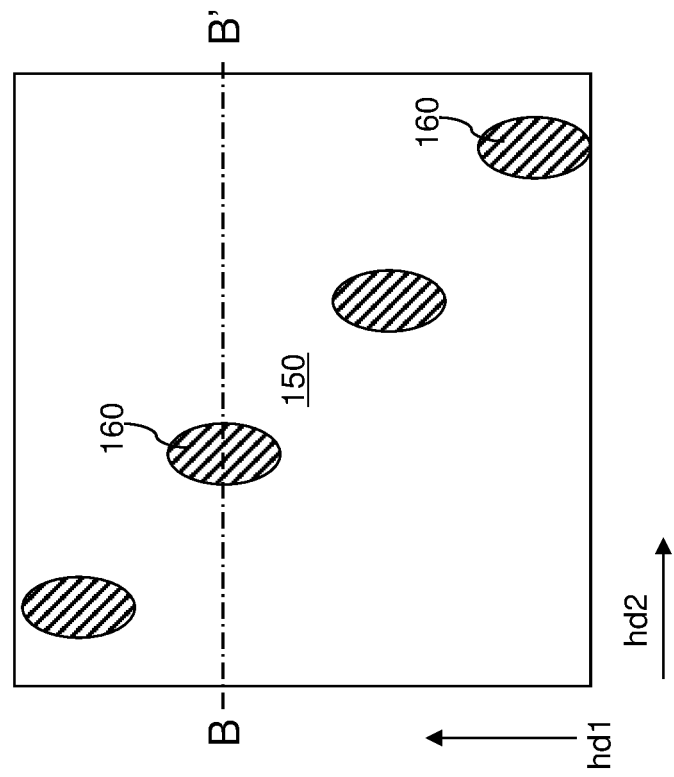
FIG. 14A is a schematic top-down view of the alternative configuration of the first exemplary structure after formation of second conductive via structures according to an embodiment of the present disclosure.

Referring to FIGS. 14A and 14B, via cavities can be formed through the second via-level dielectric layer 150. For example, a photoresist layer can be applied over the top surface of the second via-level dielectric layer 150, and can be lithographically patterned to form discrete openings that overlie a respective one of the metal line structures (142, 140). An anisotropic etch process can be performed to form via cavities underneath the discrete openings in the patterned photoresist layer. The photoresist layer can be removed, for example, by ashing.

At least one conductive material can be subsequently deposited in the via cavities. The at least one conductive material can include, for example, a metallic liner material such as TiN, TaN, or WN, or a metallic fill material such as W, Cu, Mo, Ru, Co, Al, another elemental metal, or an intermetallic alloy. Excess portions of the at least one conductive material can be removed from above the horizontal plane including the top surface of the second via-level dielectric layer 150 by a planarization process. The planarization process can include a recess etch process and/or a chemical mechanical planarization process. Each remaining portion of the at least one conductive material comprises a conductive via structure, which is herein referred to as a second conductive via structure 160. The second conductive via structures 160 can be formed on a respective one of the metal line structures (142, 140). A second conductive via structure 160 may, or may not, contact a MOF material portion 132 and/or a pair of MOF material portions 132 depending on the lateral extent of the MOF material portions 132 over the top surfaces of the metal line structures (142, 140).

The first exemplary structure can be incorporated as a component structure within another semiconductor structure to provide high density wiring with underlying via structures (such as the first connection via structures 88) and overlying via structures (such as second connection via structures 160). If the first exemplary structure is incorporated into another device, the metal line structures (142, 140) may be employed as bit lines, word lines, or word line contacts lines another device.

Figure 15:
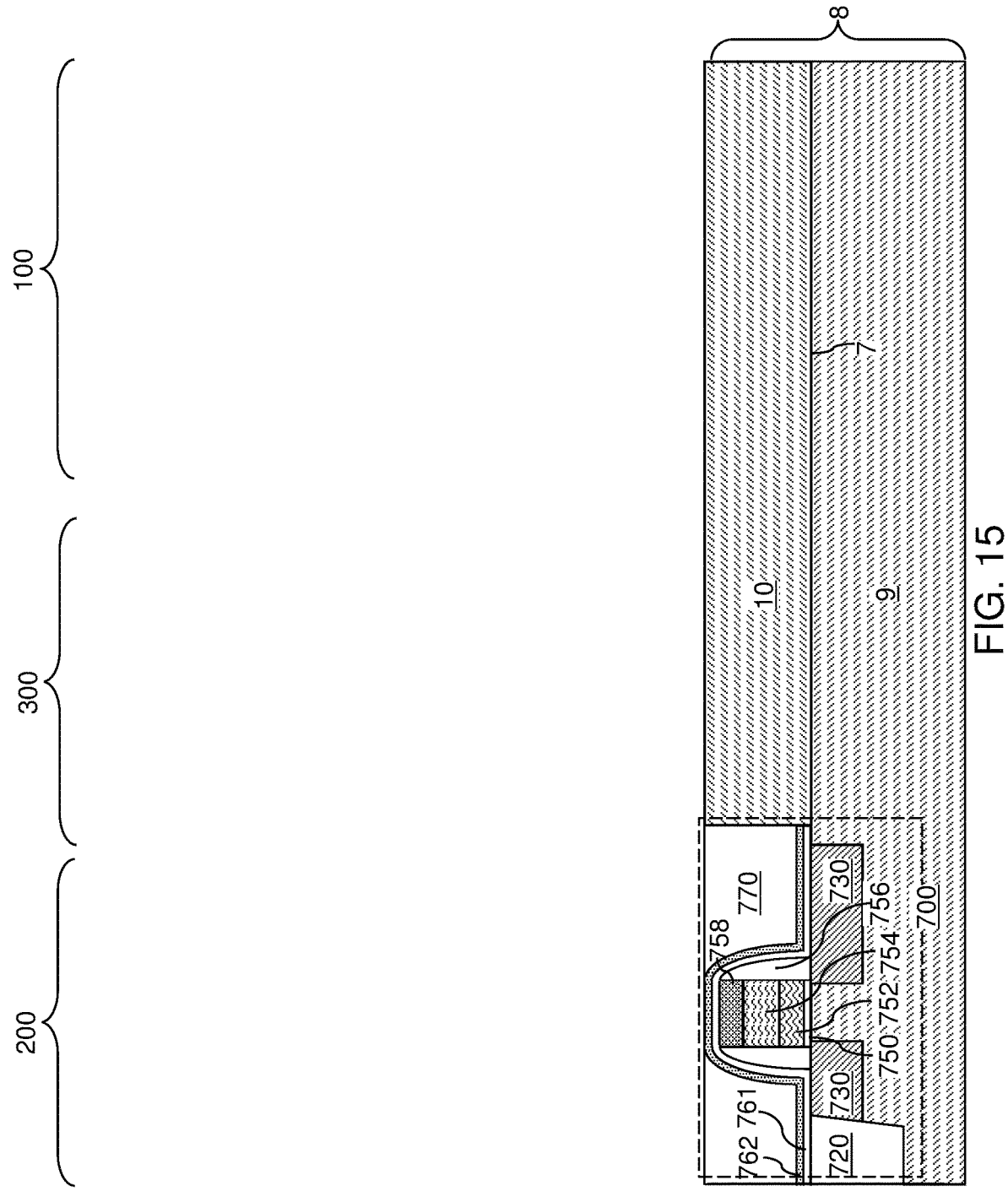
FIG. 15 is a schematic vertical cross-sectional view of a second exemplary structure after formation of at least one peripheral device and a semiconductor material layer according to an embodiment of the present disclosure.

Referring to FIG. 15, a second exemplary structure according to a second embodiment of the present disclosure is illustrated, which can be employed, for example, to fabricate a structure containing vertical NAND memory devices. The second exemplary structure is an example of incorporating the first exemplary structure into another semiconductor structure. The second exemplary structure includes a substrate 8, which can be a semiconductor substrate. The substrate 8 can include a substrate semiconductor layer 9 and an optional semiconductor material layer 10. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The at least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air). The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200. In an alternative embodiment, the at least one semiconductor device 700 is formed under the memory array region 100 in a CMOS under array ("CUA") configuration. In this case, the peripheral device region 200 may be omitted or used in combination with the CUA configuration. In another alternative embodiment, the at least one semiconductor device 700 may be formed on a separate substrate and then bonded to substrate (9, 10) containing the memory array region 100.

Figure 16:
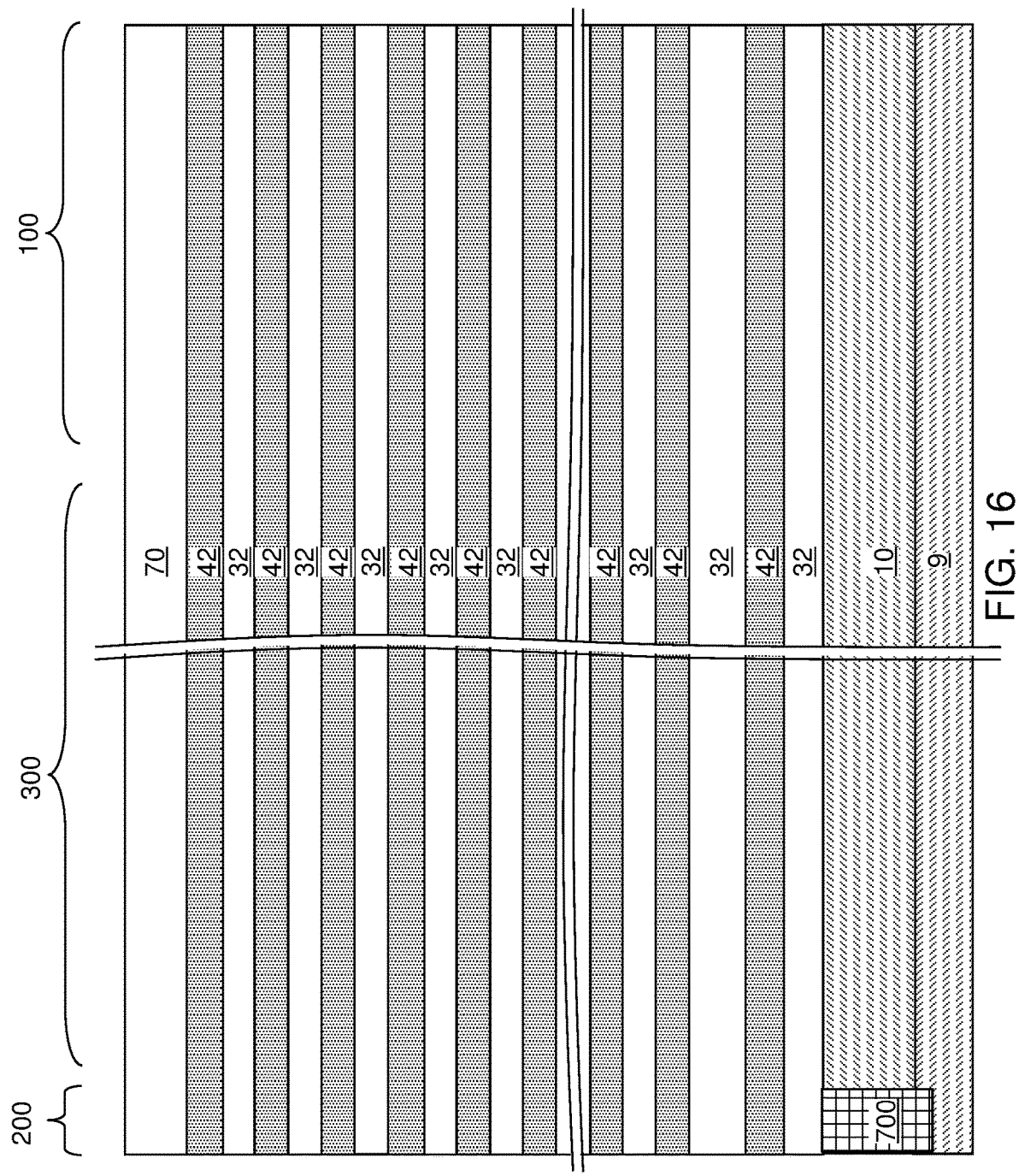
FIG. 16 is a schematic vertical cross-sectional view of the second exemplary structure after formation of an alternating stack of insulating layers and sacrificial material layers according to an embodiment of the present disclosure.

Referring to FIG. 16, a stack of an alternating plurality of first material layers (which can be insulating layers 32) and second material layers (which can be sacrificial material layer 42) is formed over the top surface of the substrate (9, 10). The stack of the alternating plurality is herein referred to as an alternating stack (32, 42). The sacrificial material layers 42 include a sacrificial material that can be removed selective to the first material of the insulating layers 32. In one embodiment, the insulating layers 32 can include silicon oxide, and sacrificial material layers can include silicon nitride sacrificial material layers. The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. Optionally, an insulating cap layer 70 can be formed over the alternating stack (32, 42).

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Figure 17:
FIG. 17 is a schematic vertical cross-sectional view of the second exemplary structure after formation of stepped terraces and a retro-stepped dielectric material portion according to an embodiment of the present disclosure.

Referring to FIG. 17, stepped surfaces are formed at a peripheral region of the alternating stack (32, 42), which is herein referred to as a terrace region. A stepped cavity is formed within the volume from which portions of the alternating stack (32, 42) are removed through formation of the stepped surfaces. A "stepped cavity" refers to a cavity having stepped surfaces. The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. Optionally, drain select level isolation structures 72 can be formed through the insulating cap layer 70 and a subset of the sacrificial material layers 42 located at drain select levels.

Figure 18A:
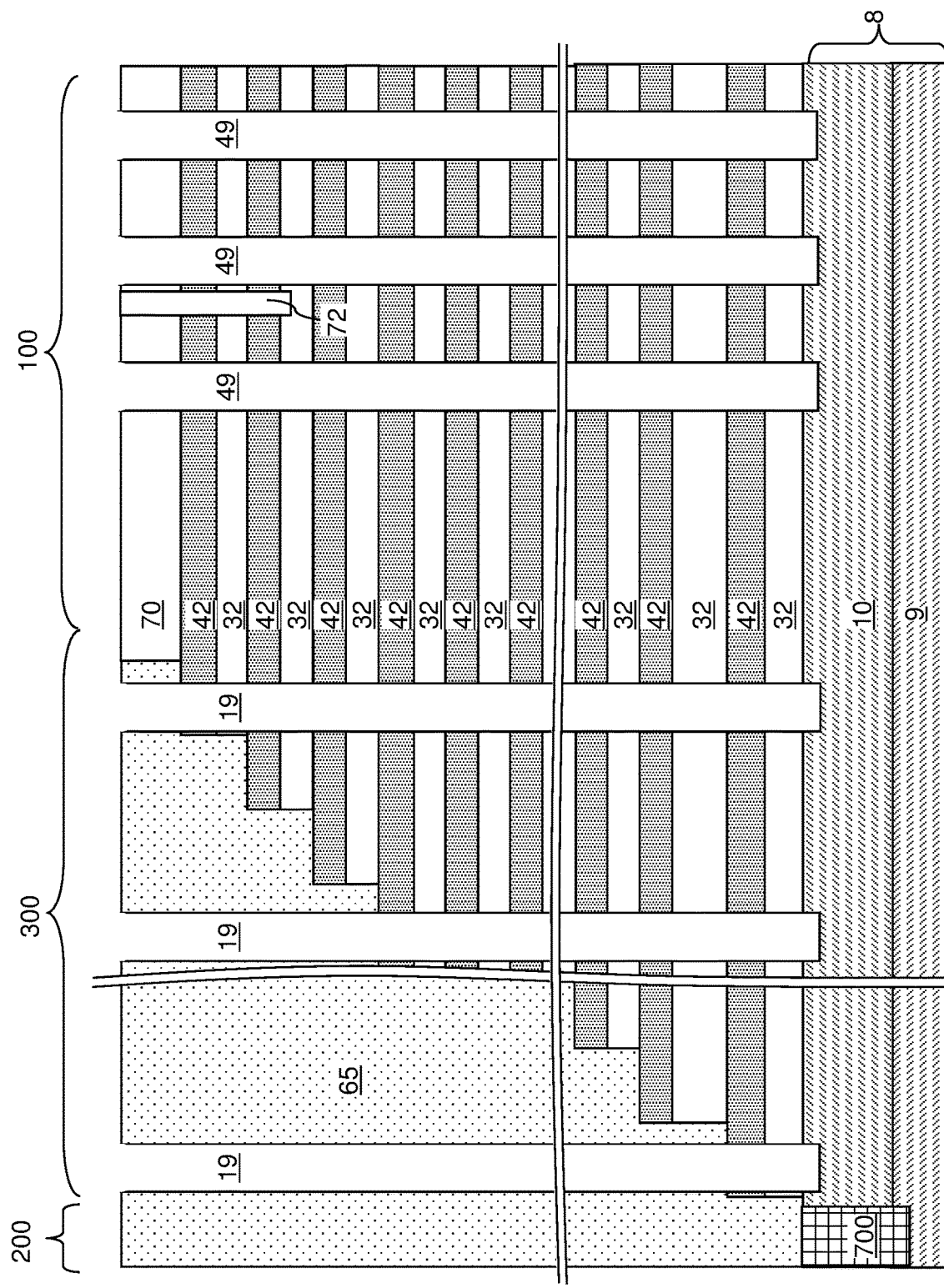
FIG. 18A is a schematic vertical cross-sectional view of the second exemplary structure after formation of memory openings and support openings according to an embodiment of the present disclosure.
Figure 18B:
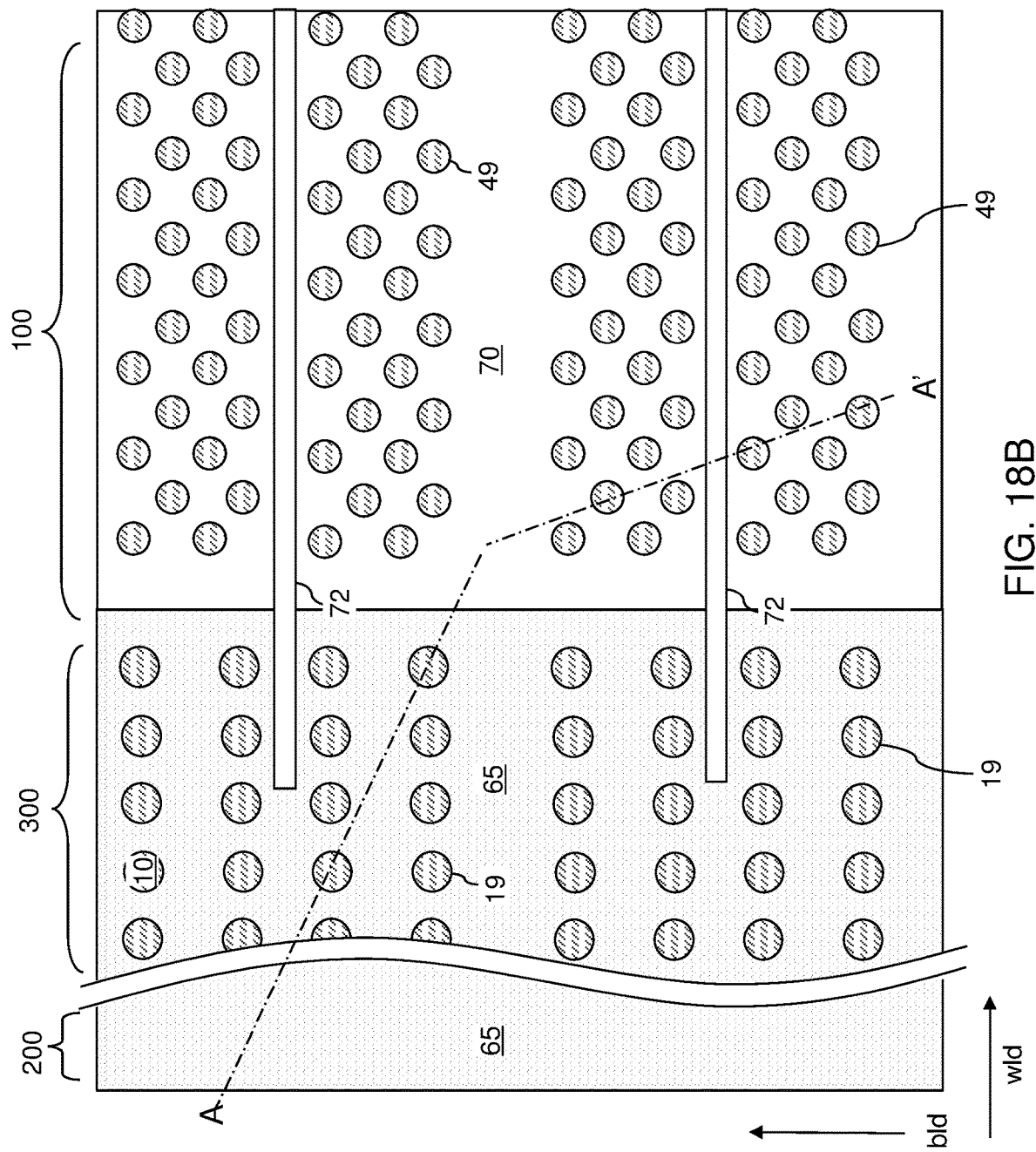
FIG. 18B is a top-down view of the second exemplary structure of FIG. 18A. The vertical plane A-A' is the plane of the cross-section for FIG. 18A.

Referring to FIGS. 18A and 18B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300. The memory openings 49 can be arranged as rows that laterally extend along a horizontal direction, which is herein referred to as a word line direction wd. The rows of the memory openings 49 can be laterally spaced from each other along a horizontal direction that is perpendicular to the word line direction wd, which is herein referred to as a bit line direction bd, along which bit lines are subsequently formed.

FIGS. 19A-19H illustrate structural changes in a memory opening 49, which is one of the memory openings 49 in the second exemplary structure of FIGS. 4A and 4B. The same structural change occurs simultaneously in each of the other memory openings 49 and in each of the support openings 19.

Referring to FIG. 19A, a memory opening 49 in the exemplary structure of FIGS. 18A and 18B is illustrated. The memory opening 49 extends through the insulating cap layer 70, the alternating stack (32, 42), and optionally into an upper portion of the semiconductor material layer 10.

Referring to FIG. 19B, an optional pedestal channel portion (e.g., an epitaxial pedestal) 11 can be formed at the bottom portion of each memory opening 49 and each support openings 19, for example, by selective epitaxy. A memory cavity 49' is present within the unfilled volume of each memory opening 49.

Figure 19D:
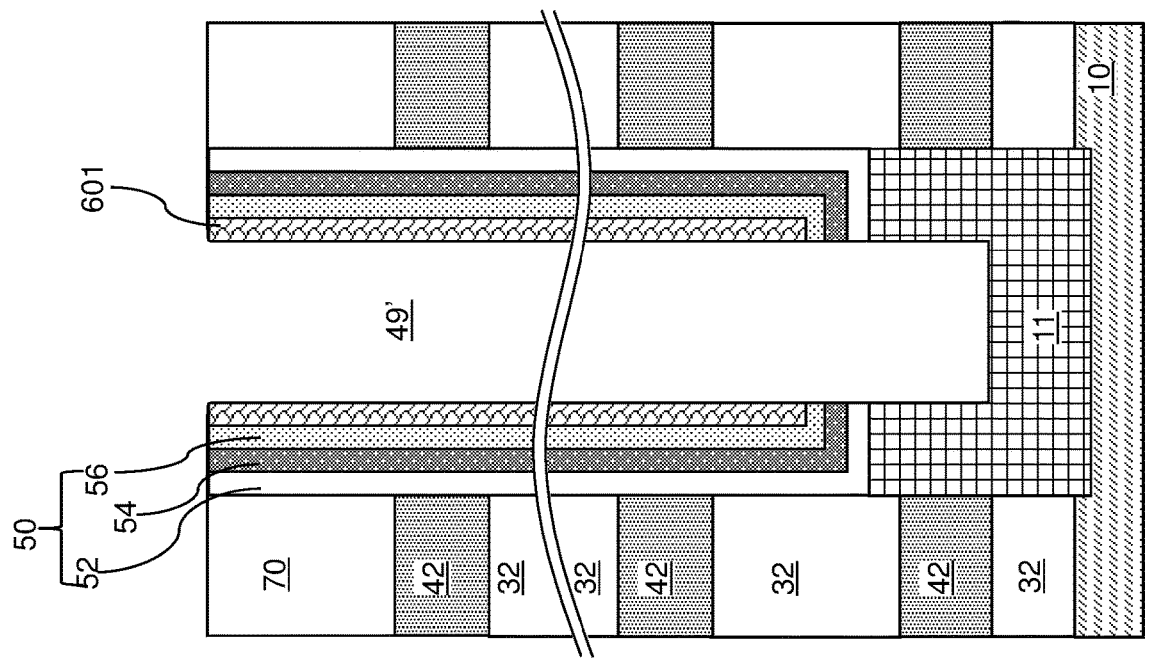
Figure 19C:
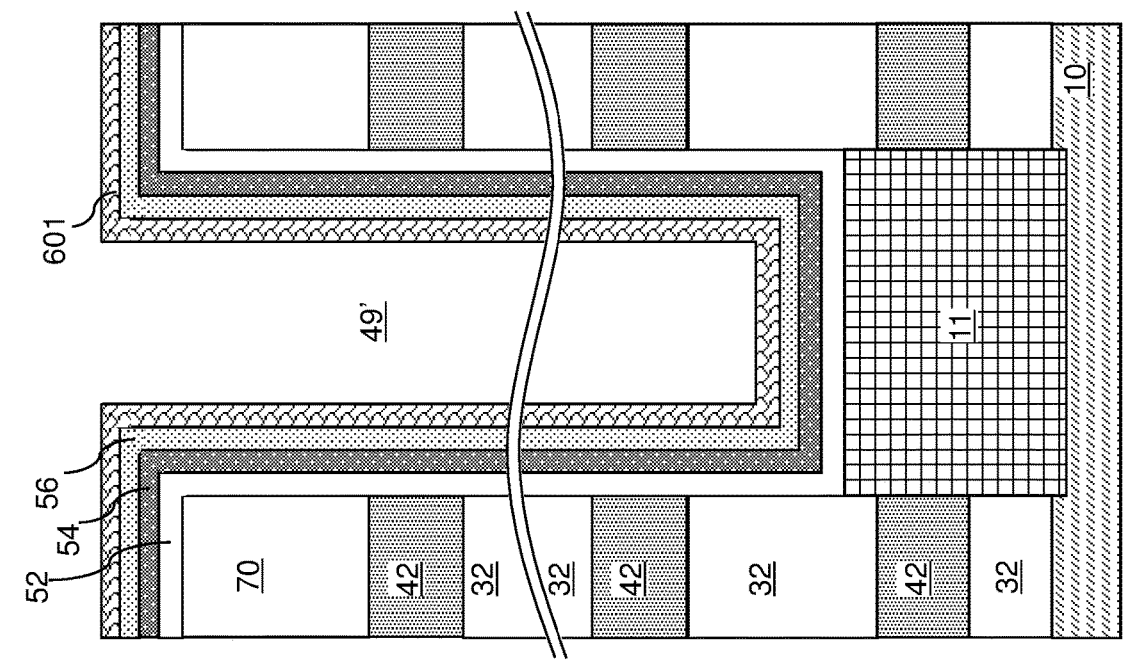

Referring to FIG. 19C, a stack of layers including a blocking dielectric layer 52, a charge storage layer 54, a tunneling dielectric layer 56, and an optional first semiconductor channel layer 601 can be sequentially deposited in the memory openings 49.

Referring to FIG. 19D, the optional first semiconductor channel layer 601, the tunneling dielectric layer 56, the charge storage layer 54, and the blocking dielectric layer 52 are sequentially anisotropically etched employing at least one anisotropic etch process. Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

Referring to FIG. 19E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601.

Referring to FIG. 19F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening.

Referring to FIG. 19G, the material of the dielectric core layer 62L can be vertically recessed selective to the semiconductor material of the second semiconductor channel layer 602 into each memory opening 49 down to a depth between a first horizontal plane including the top surface of the insulating cap layer 70 and a second horizontal plane including the bottom surface of the insulating cap layer 70. Each remaining portion of the dielectric core layer 62L constitutes a dielectric core 62.

Referring to FIG. 19H, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. Excess portions of the deposited semiconductor material can be removed from above the top surface of the insulating cap layer 70, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the insulating cap layer 70 can be concurrently removed by a planarization process. Each remaining portion of the second semiconductor channel layer 602 can be located entirely within a memory opening 49 or entirely within a support opening 19.

Each remaining portion of the doped semiconductor material having a doping of the second conductivity type constitutes a drain region 63. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a tunneling dielectric layer 56, a charge storage layer 54, and a blocking dielectric layer 52 collectively constitute a memory film 50, which includes a vertical stack of memory elements that can store a respective data bit with a macroscopic retention time. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising portions of the charge storage layer 54, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20.

Figure 20:
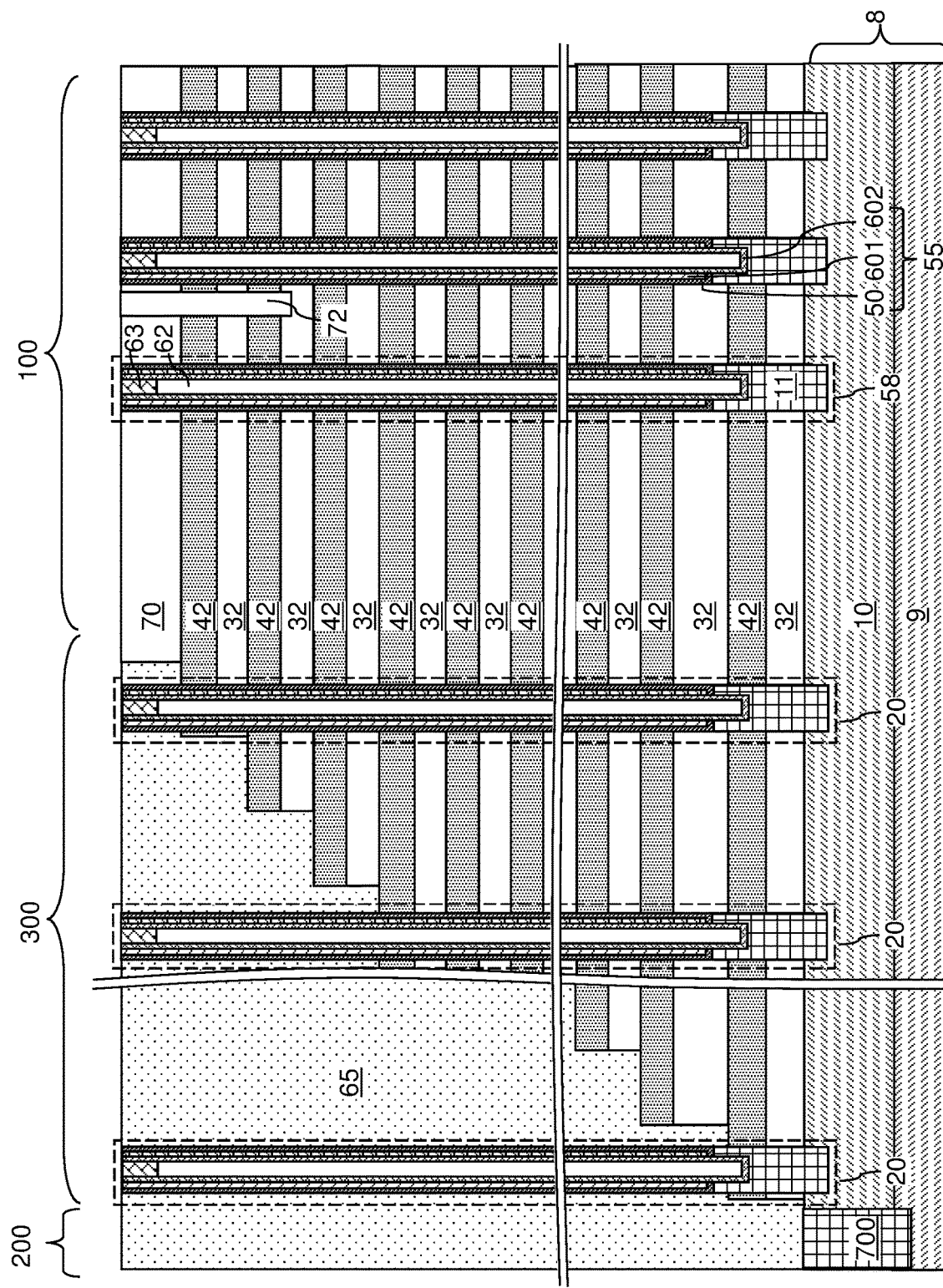
FIG. 20 is a schematic vertical cross-sectional view of the second exemplary structure after formation of memory stack structures and support pillar structures according to an embodiment of the present disclosure.

Referring to FIG. 20, the second exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 18A and 18B. An instance of the support pillar structure 20 can be formed within each support opening 19 of the structure of FIGS. 18A and 18B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 21A:
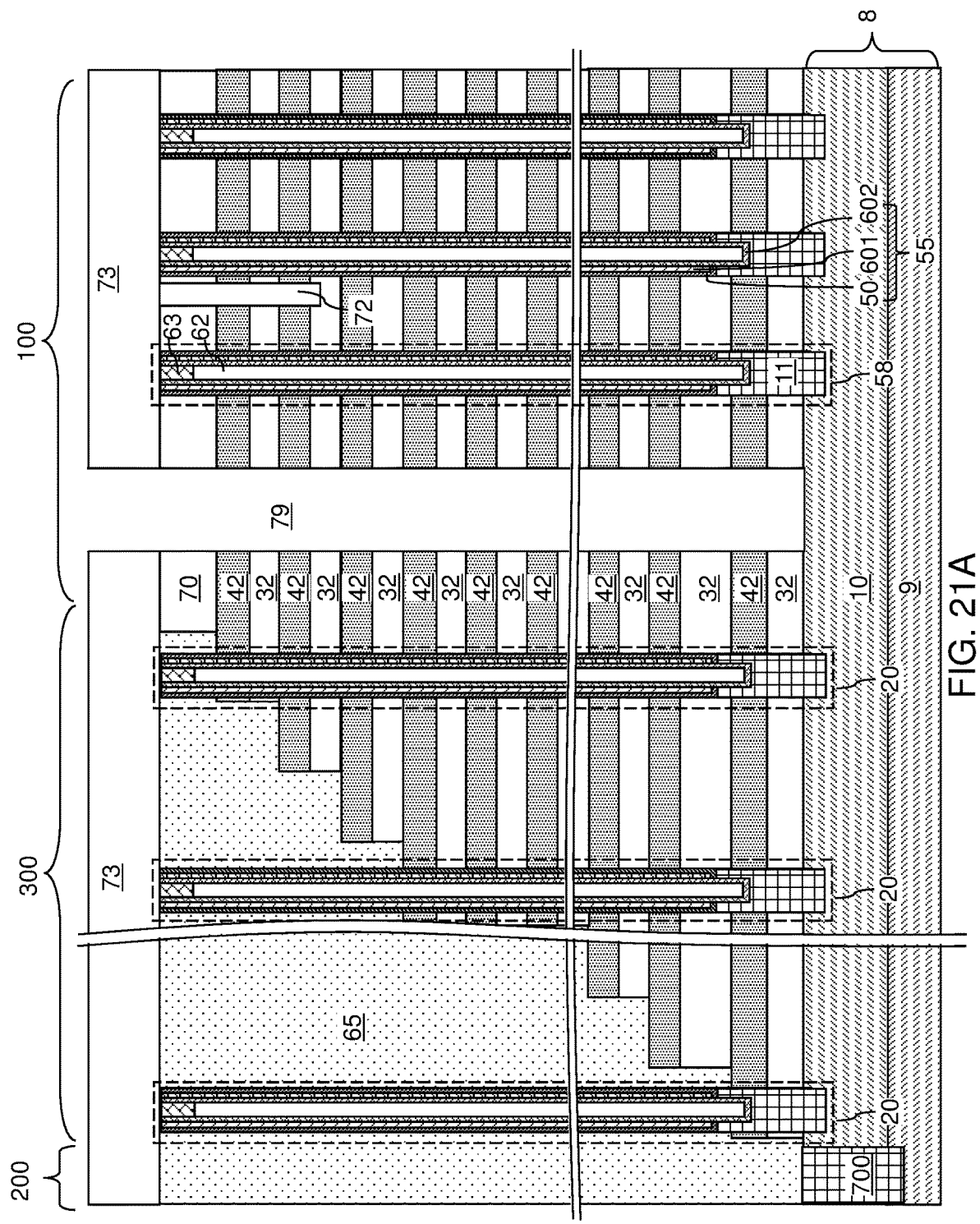
FIG. 21A is a schematic vertical cross-sectional view of the second exemplary structure after formation of backside trenches according to an embodiment of the present disclosure.
Figure 21B:
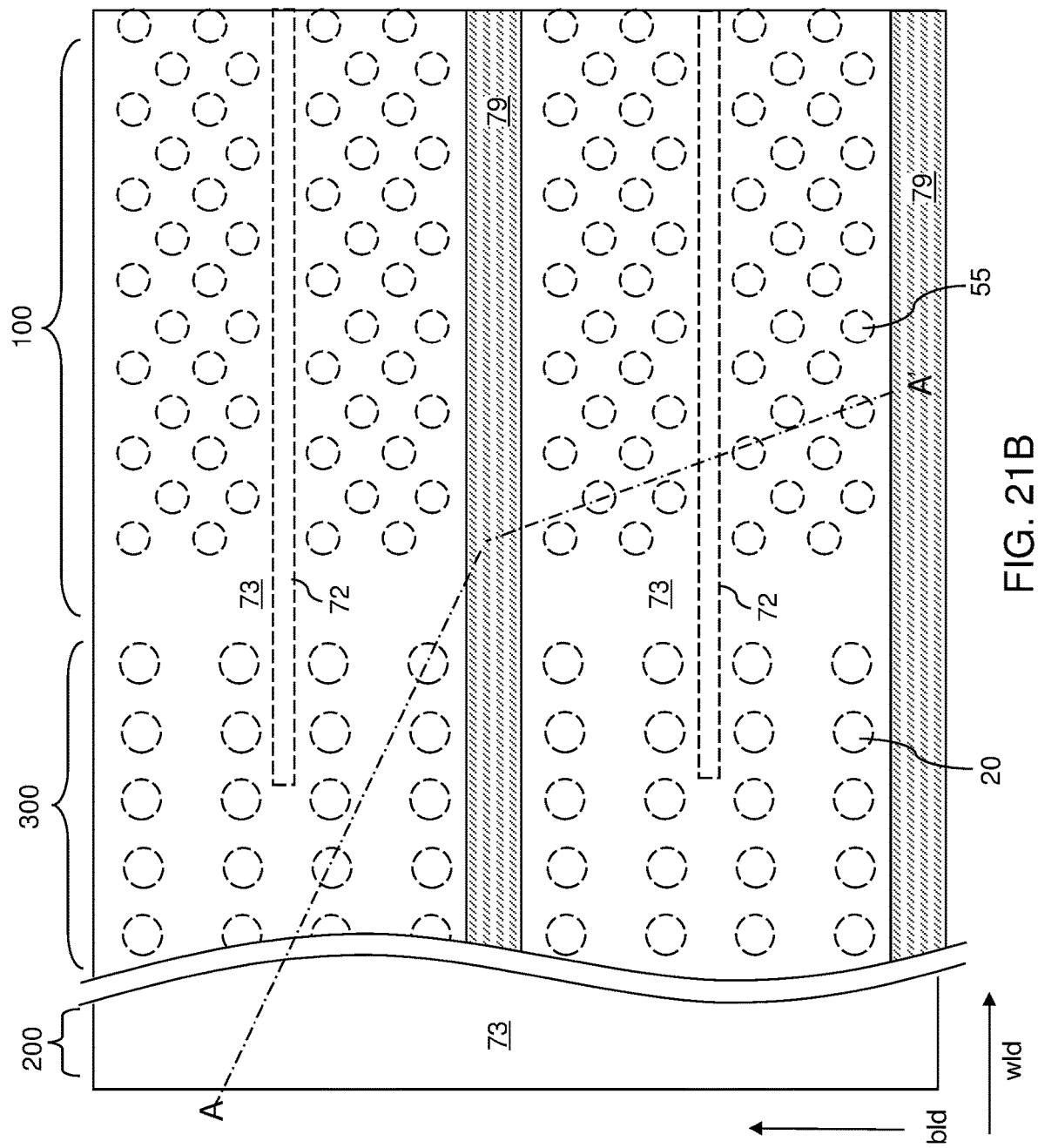
FIG. 21B is a partial see-through top-down view of the second exemplary structure of FIG. 21A. The vertical plane A-A' is the plane of the schematic vertical cross-sectional view of FIG. 21A.

Referring to FIGS. 21A and 21B, a first via-level dielectric layer 73 can be formed over the alternating stack (32, 42) of insulating layer 32 and sacrificial material layers 42, and over the memory stack structures 55 and the support pillar structures 20. A photoresist layer (not shown) can be applied over the first via-level dielectric layer 73, and is lithographically patterned to form openings in areas between clusters of memory stack structures 55. The pattern in the photoresist layer can be transferred through the first via-level dielectric layer 73, the alternating stack (32, 42) and/or the retro-stepped dielectric material portion 65 employing an anisotropic etch to form backside trenches 79, which vertically extend from the top surface of the first via-level dielectric layer 73 at least to the top surface of the substrate (9, 10), and laterally extend through the memory array region 100 and the staircase region 300.

In one embodiment, the backside trenches 79 can laterally extend along the word line direction wld and can be laterally spaced apart from each other along the bit line direction bld. The memory stack structures 55 can be arranged in rows that extend along the word line direction wld. The drain select level isolation structures 72 can laterally extend along the word line direction wld. Each backside trench 79 can have a uniform width that is invariant along the lengthwise direction (i.e., along the word line direction wld). Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 22:
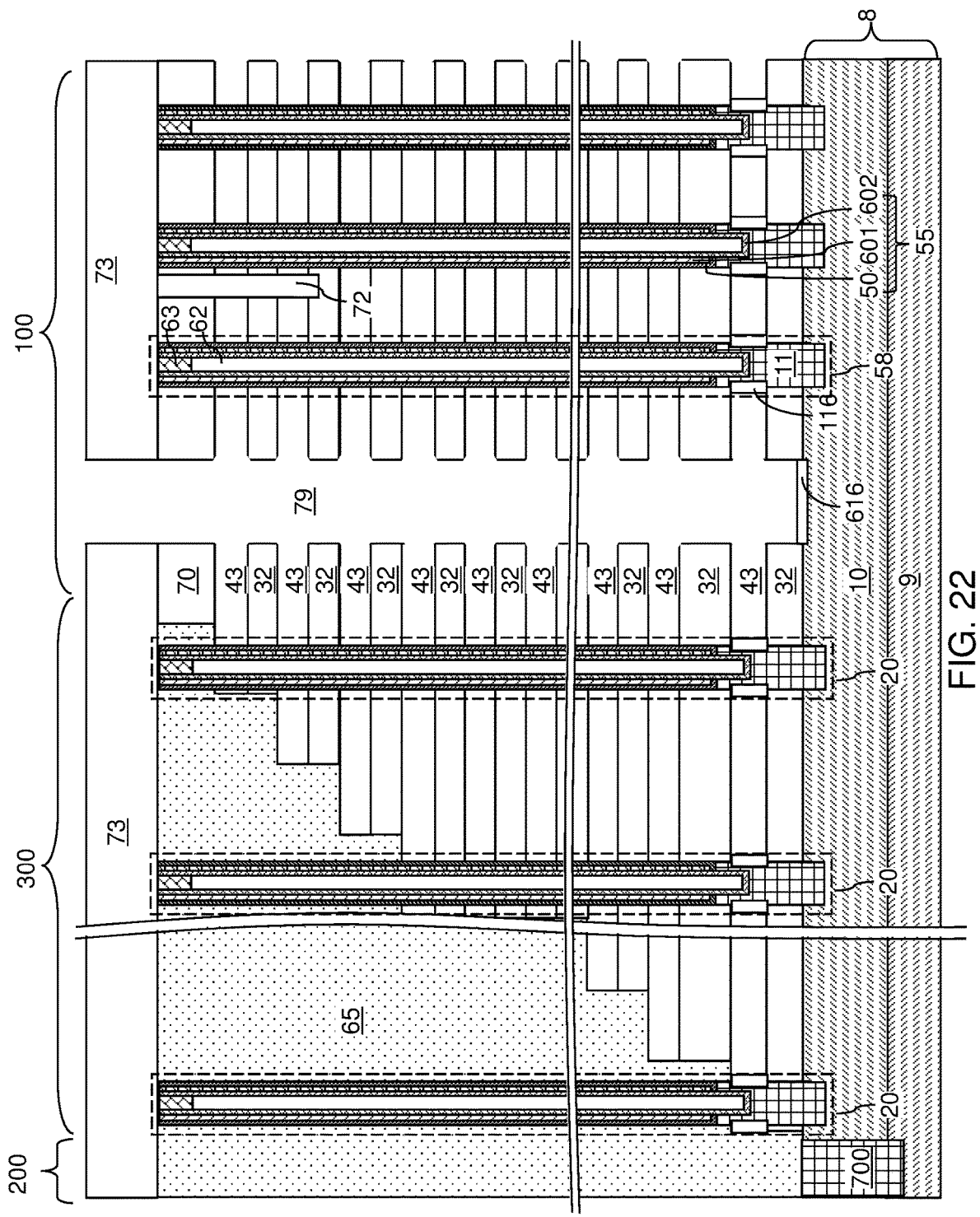
FIG. 22 is a schematic vertical cross-sectional view of the second exemplary structure after formation of backside recesses according to an embodiment of the present disclosure.

Referring to FIGS. 22 and 23A, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

Each backside recess 43 can be a laterally extending cavity having a lateral dimension that is greater than the vertical extent of the cavity. Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616.

Referring to FIG. 23B, a backside blocking dielectric layer 44 can be optionally formed. The backside blocking dielectric layer 44, if present, comprises a dielectric material that functions as a control gate dielectric for the control gates to be subsequently formed in the backside recesses 43.

Referring to FIG. 23C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD).

Figure 24:
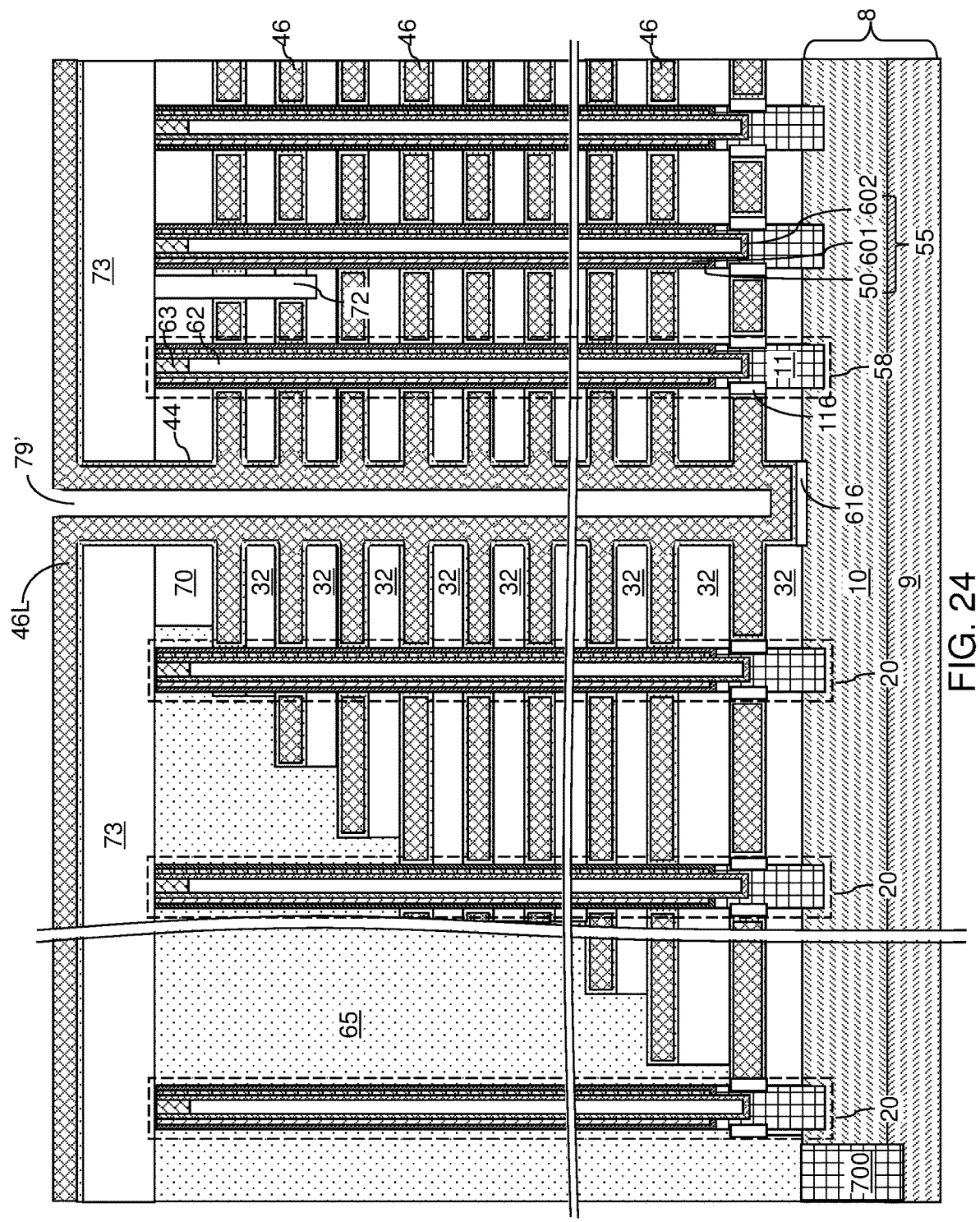
FIG. 24 is a schematic vertical cross-sectional view of the second exemplary structure at the processing step of FIG. 23D.

Referring to FIGS. 23D and 24, a metal fill material is deposited in the plurality of backside recesses 43, on the sidewalls of the at least one backside trench 79, and over the top surface of the first via-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. The at least one elemental metal of the metallic fill material layer 46B can be selected, for example, from tungsten, cobalt, ruthenium, titanium, and tantalum.

A plurality of electrically conductive layers 46 can be formed in the plurality of backside recesses 43, and a continuous electrically conductive material layer 46L can be formed on the sidewalls of each backside trench 79 and over the first via-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the first via-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 25A:
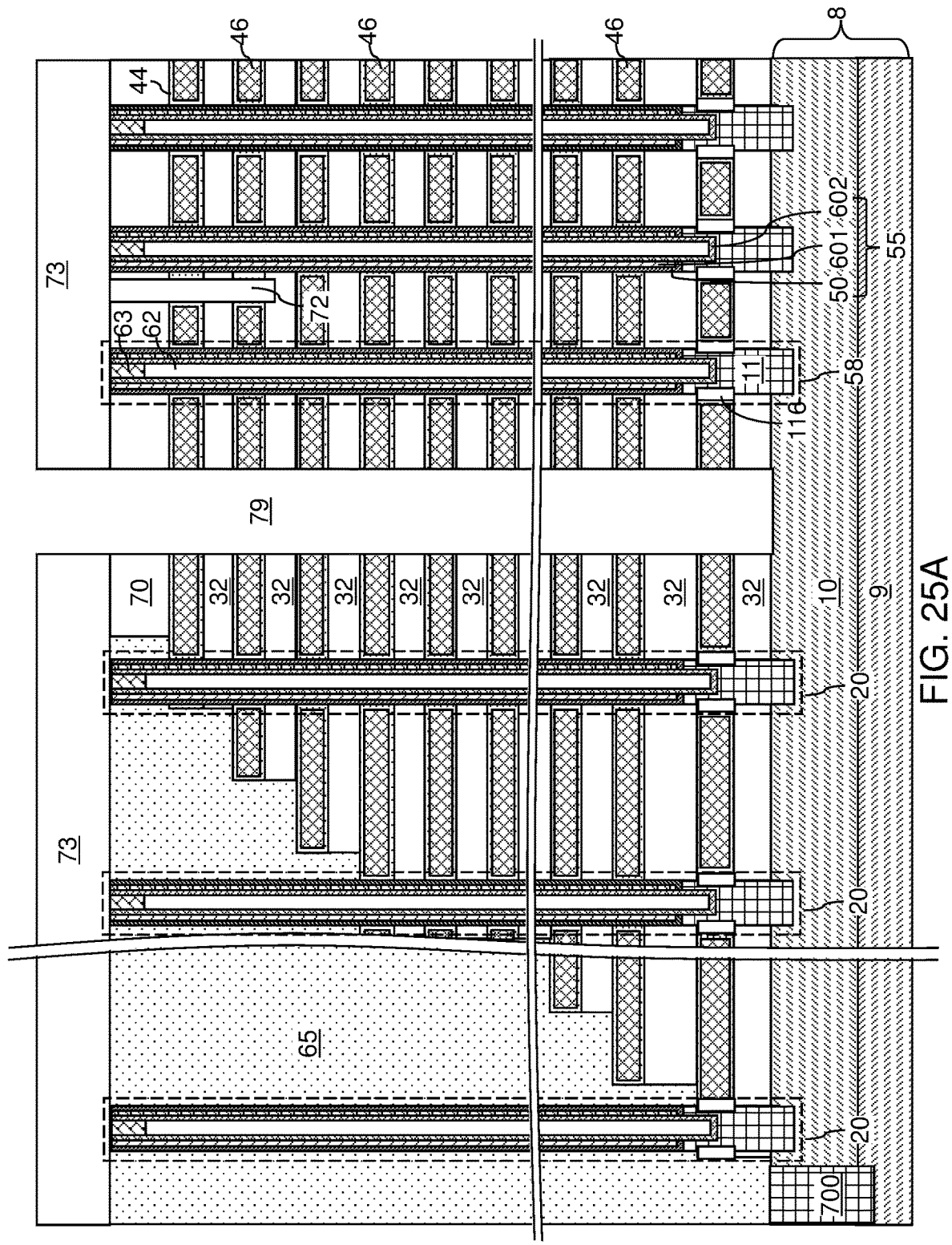
FIG. 25A is a schematic vertical cross-sectional view of the second exemplary structure after removal of a deposited conductive material from within the backside trench according to an embodiment of the present disclosure.
Figure 25B:
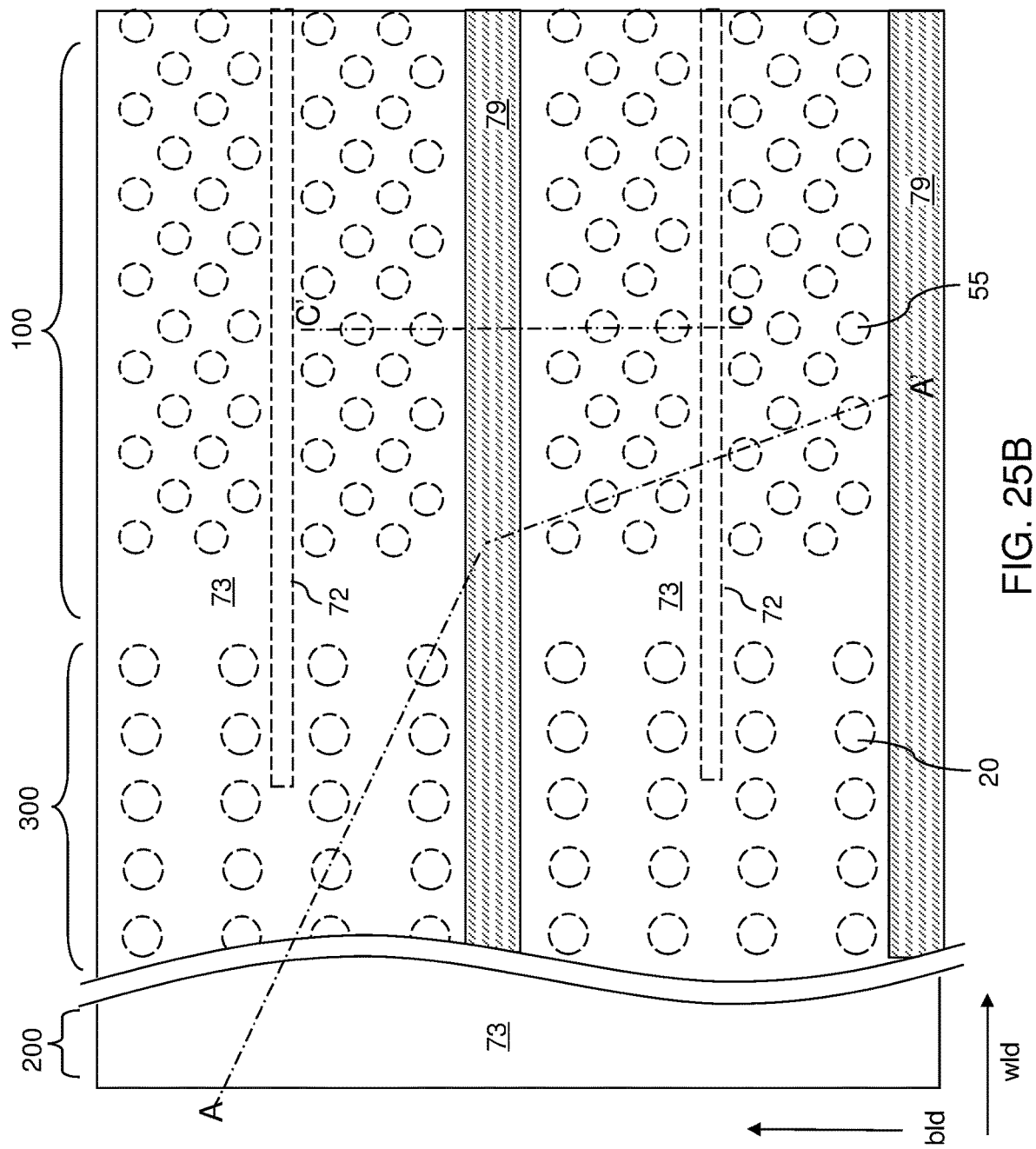
FIG. 25B is a partial see-through top-down view of the second exemplary structure of FIG. 25A. The vertical plane A-A' is the plane of the schematic vertical cross-sectional view of FIG. 25A.
Figure 25C:
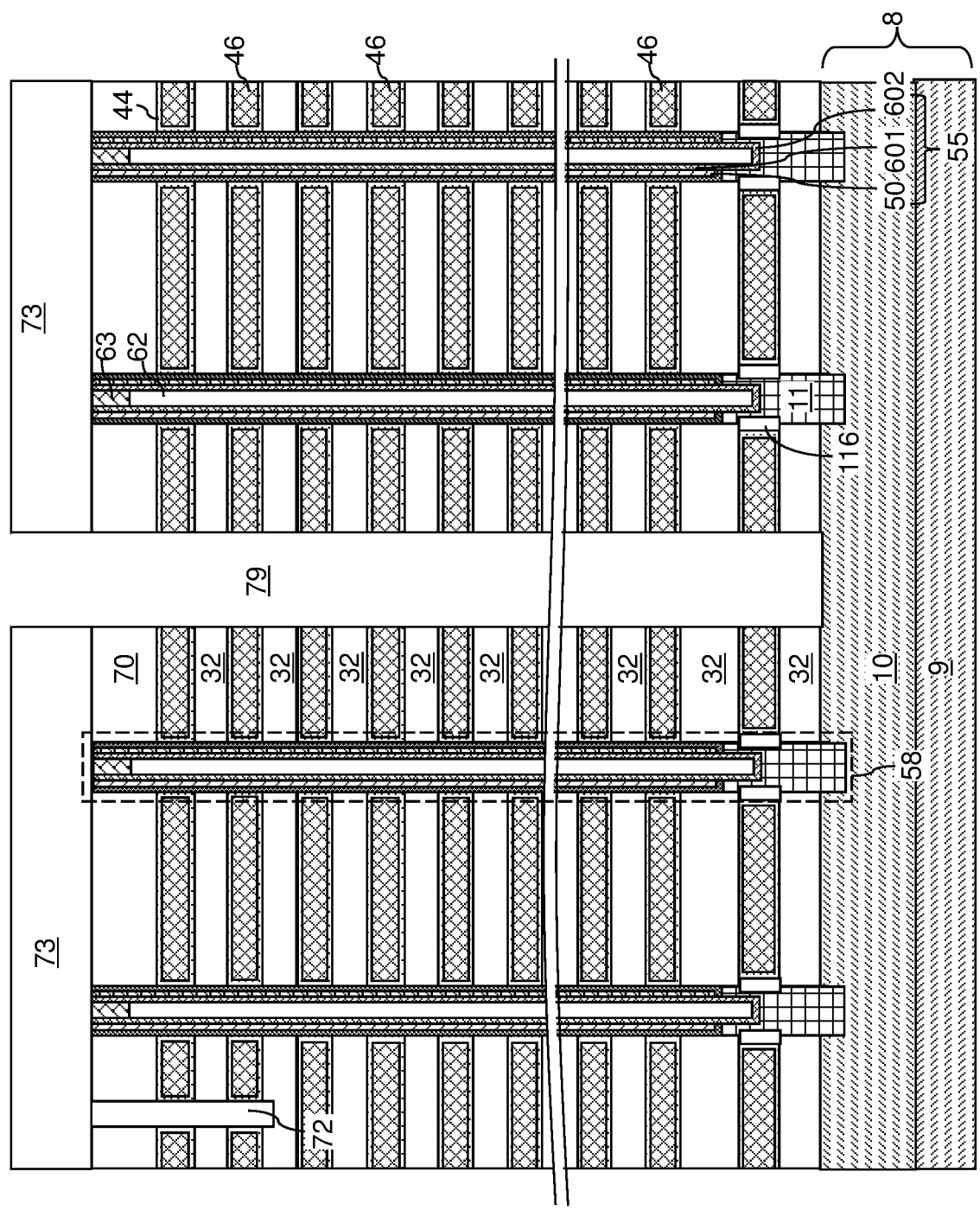
FIG. 25C is a vertical cross-sectional view of the second exemplary structure along the vertical plane C-C' of FIG. 25B.

Referring to FIG. 25, the deposited metallic material of the continuous electrically conductive material layer 46L is etched back from the sidewalls of each backside trench 79 and from above the first via-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Figure 26A:
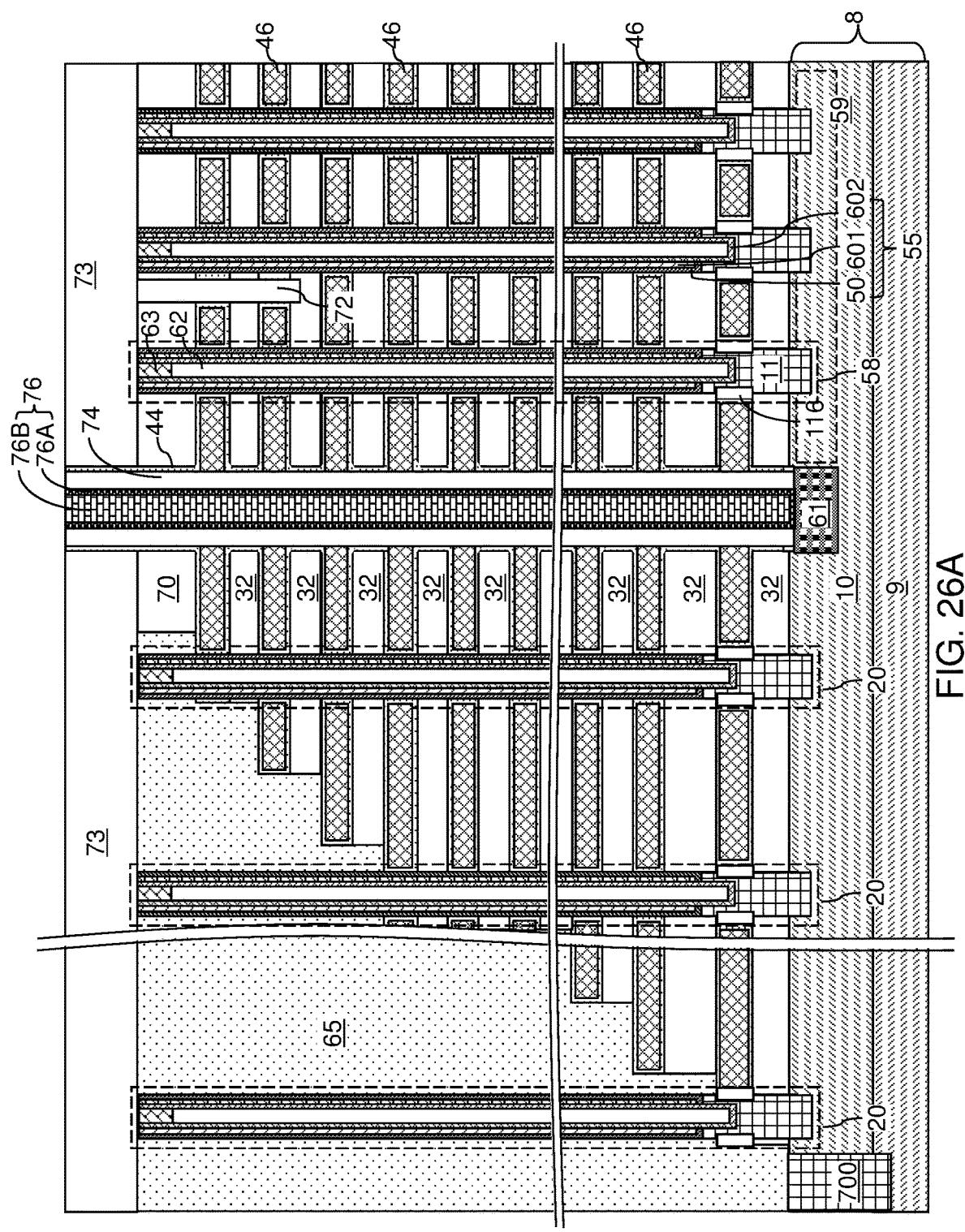
FIG. 26A is a schematic vertical cross-sectional view of the second exemplary structure after formation of an insulating spacer and a backside contact structure according to an embodiment of the present disclosure.

Referring to FIGS. 26A and 26B, an insulating material layer can be formed in the backside trenches 79 and over the first via-level dielectric layer 73 by a conformal deposition process. An anisotropic etch is performed to remove horizontal portions of the insulating material layer from above the first via-level dielectric layer 73 and at the bottom of each backside trench 79. Each remaining portion of the insulating material layer constitutes an insulating spacer 74. A backside cavity 79' is present within a volume surrounded by each insulating spacer 74.

A source region 61 can be formed at a surface portion of the semiconductor material layer 10 under each backside cavity 79' by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The conductive fill material portion 76B can include a metal or a metallic alloy. For example, the conductive fill material portion 76B can include W, Cu, Al, Co, Ru, Ni, an alloy thereof, or a stack thereof. The at least one conductive material can be planarized employing the first via-level dielectric layer 73 overlying the alternating stack (32, 46) as a stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61.

Figure 27A:
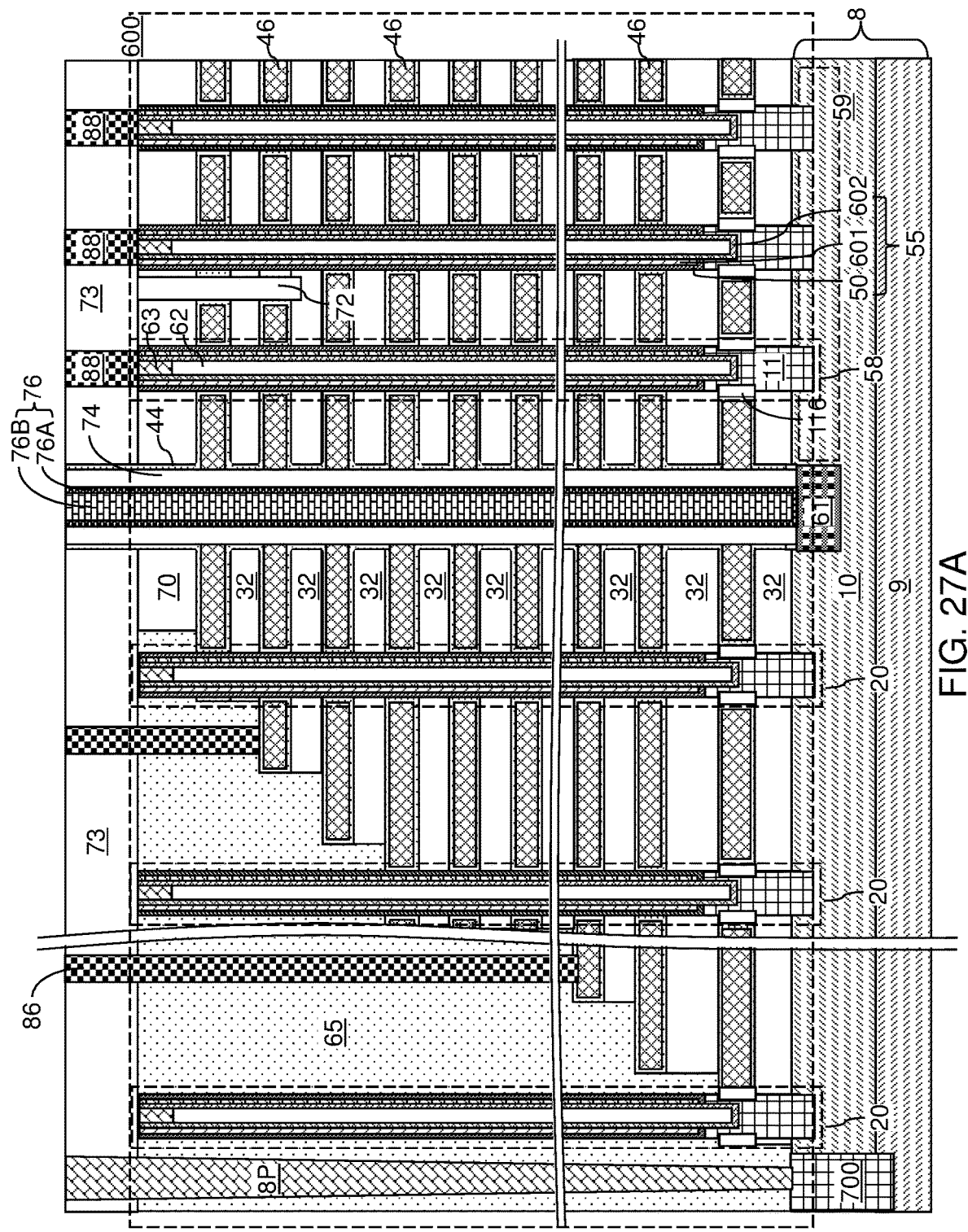
FIG. 27A is a schematic vertical cross-sectional view of the second exemplary structure after formation of additional contact via structures according to an embodiment of the present disclosure.
Figure 27B:
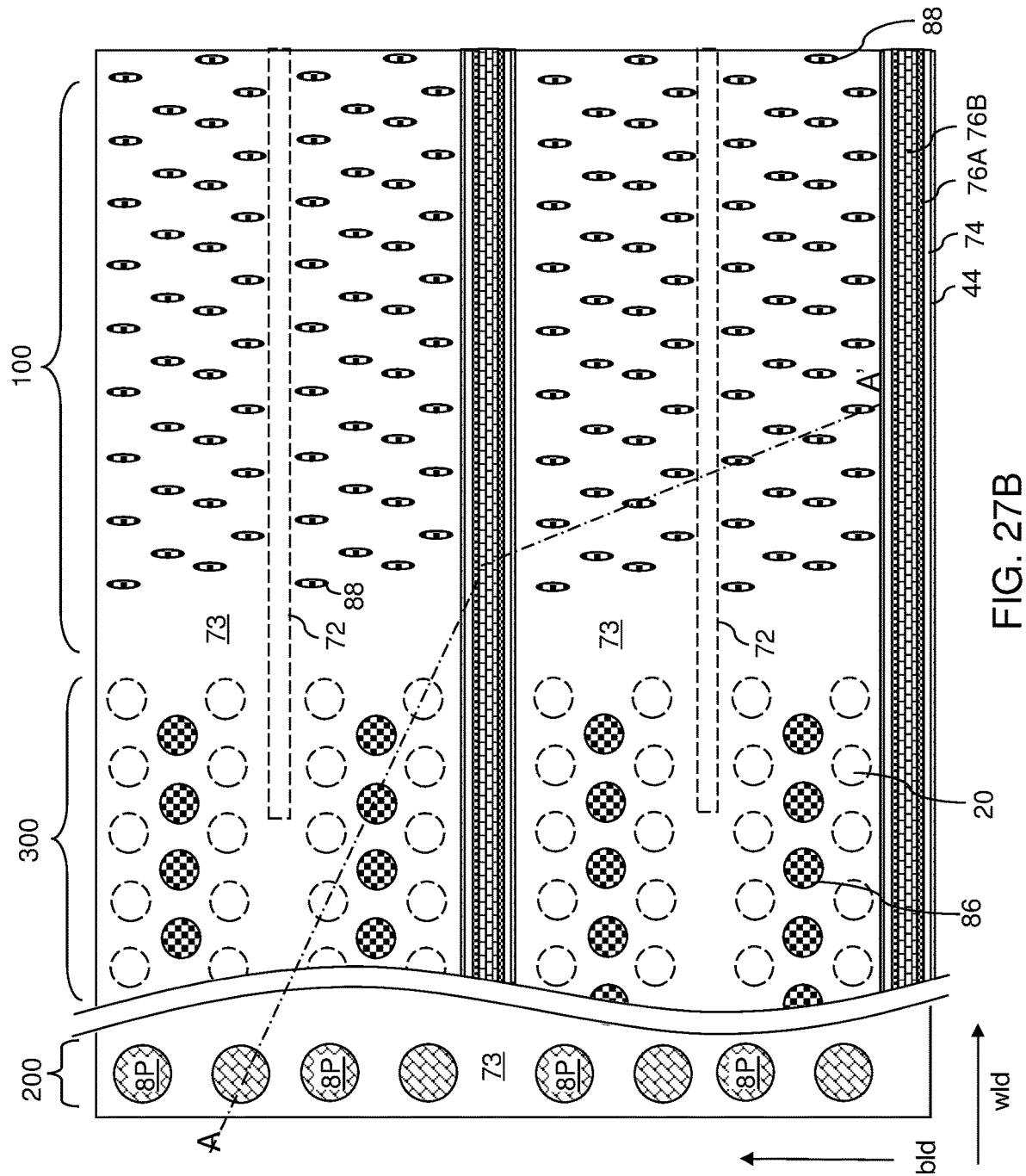
FIG. 27B is a top-down view of the second exemplary structure of FIG. 27A. The vertical plane A-A' is the plane of the schematic vertical cross-sectional view of FIG. 27A.

Referring to FIGS. 27A and 27B, additional contact via structures (88, 86, 8P) can be formed through the first via-level dielectric layer 73, and optionally through the retro-stepped dielectric material portion 65. For example, first conductive via structures 88 can be formed through the first via-level dielectric layer 73 on each drain region 63. Word line contact via structures 86 can be formed on the electrically conductive layers 46 through the first via-level dielectric layer 73, and through the retro-stepped dielectric material portion 65. Peripheral device contact via structures 8P can be formed through the retro-stepped dielectric material portion 65 directly on respective nodes of the peripheral devices.

The set of all semiconductor devices formed on the substrate 8 and below the bottom surface of the first via-level dielectric layer 73 constitutes a device structure 600, over which the first exemplary structure described above can be formed. In the illustrative example, the first conductive via structures 88 can be drain contact via structures contacting a respective drain region 63. In this case, the electrically conductive nodes of the device structure 600 include the drain regions 63 of the memory stack structures 55. In this embodiment, the device structure 600 comprises a three-dimensional memory device, such as a NAND memory device. However, other device structures may be used instead.

Figure 28:
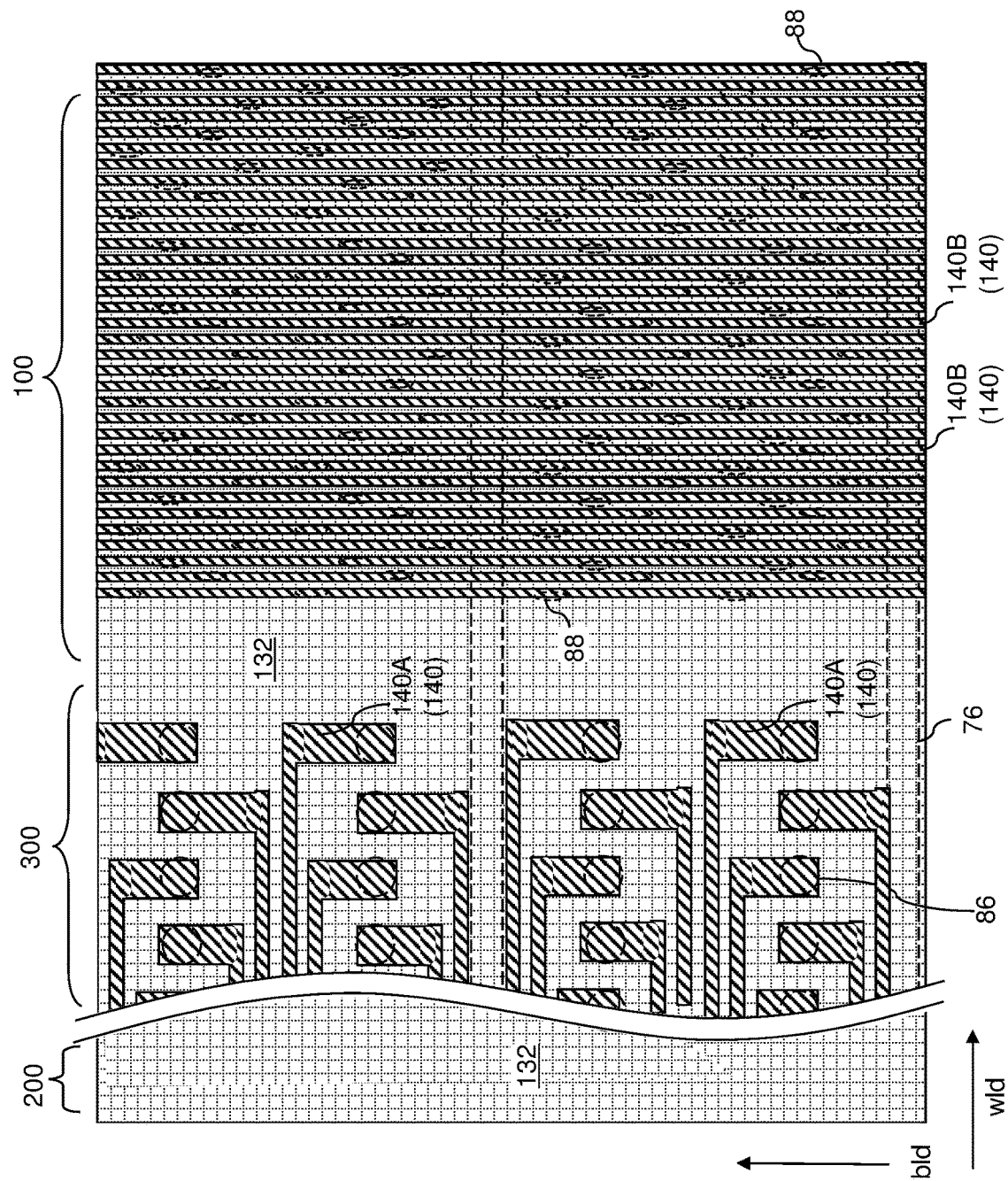
FIG. 28 is a schematic top-down view of the second exemplary structure after formation of the metal line structures of the first exemplary structure as bit lines according to an embodiment of the present disclosure.

Referring to FIG. 28, the processing steps of FIGS. 2A-11B, or FIGS. 2A-8B and 12A-14B can be performed to form the metal line structures (142, 140) such as bit lines 140B contacting a respective subset of the first connection via structures 88 and additional metal lines 140A (e.g., word line contact lines) contacting a respective one of the word line contact via structures 86. The bit lines 140B can laterally extend along the bit line direction bld, and may form a periodic one-dimensional array having a uniform thickness and a uniform pitch along the word line direction wld. The MOF material portions 132 may, or may not, fill the entire volume between neighboring pairs of metal line structures (142, 140). In case a gap is present between neighboring pairs of MOF material portions 132, a second via-level dielectric layer 150 described above can fill such a gap with, or without, an encapsulated void (i.e., airgap) 139 depending on the size of the gap.

While a three-dimensional memory device is employed as an exemplary device structure 600 over which the metal line structures (142, 140) and the MOF material portions 132 of embodiments of the present disclosure can be formed, the features of embodiments of the present disclosure can be incorporated into any structure including a region in which metal line structures (142, 140) can be formed with MOF material portions 132 thereamongst.

Referring to all drawings and according to various embodiments of the present disclosure, a structure is provided, which comprises: metal line structures (142, 140) located over a substrate 8 and laterally spaced apart from each other, wherein each of the metal line structures (142, 140) comprises a planar metallic liner 142 including a first metal element and a metal line body portion 140 comprising a second metal element that is different from the first metal element; and metal-organic framework (MOF) material portions 132 located between neighboring pairs of the metal line structures (142, 140) and comprising metal ions or clusters of the first metal element and organic ligands connected to the metal ions or clusters of the first metal element.

In one embodiment, each of the planar metallic liners 142 has a uniform thickness throughout. In one embodiment, one of the metal line structures (142, 140) comprises a first planar metallic liner 142 of the planar metallic liners 142 and a first metal line body portion 140 of the metal line body portions 140; the first planar metallic liner 142 has a first width w1; and the first metal line body portion 140 has a second width w2 that is greater than the first width w1. In one embodiment, a lateral offset distance between a sidewall of the first planar metallic liner 142 and a sidewall of the first metal line body portion 140 is one half of a difference between the second width w2 and the first width w1.

In one embodiment, a first via-level dielectric layer 73 can be located between the substrate 8 and a horizontal plane including bottom surfaces of the planar metallic liners 142. The planar metallic liners 142 contact a top surface of the first via-level dielectric layer 73. First conductive via structures 88 can be embedded in the first via-level dielectric layer 73, and can contact a bottom surface of a respective one of the planar metallic liners 142. A second via-level dielectric layer 150 can be located over the metal line structures (142, 140) and can embed second conductive via structures 160 therein.

In one embodiment, a bottommost surface of the second via-level dielectric layer 150 does not contact the first via-level dielectric layer 73, and is vertically spaced from the first via-level dielectric layer 73 by one of the MOF material portions 132.

In one embodiment, an entirety of a volume located between a neighboring pair of metal line structures (142, 140) of the metal line structures (142, 140) and between the first via-level dielectric layer 73 and the second via-level dielectric layer 150 is filled with one of the MOF material portions 132.

In one embodiment, the second via-level dielectric layer 150 comprises downward-protruding portions that contact sidewalls of the MOF material portions 132. In one embodiment, the second via-level dielectric layer 150 contacts portions of the top surface of the first via-level dielectric layer 73.

In one embodiment, encapsulated voids 139 that are free of any solid material therein are located between neighboring pairs of the MOF material portions 132 between the first via-level dielectric layer 73 and the second via-level dielectric layer 150.

In one embodiment, the planar metallic liners 142 consist essentially of atoms of the first metal element, and the first metal element is one of titanium, molybdenum, copper, cobalt, zirconium, zinc, manganese, or ruthenium.

In one embodiment, an alternating stack of insulating layers 32 and electrically conductive layers 46 can be located between the substrate 8 and the metal line structures (142, 140). Memory stack structures 55 can vertically extend through the alternating stack (32, 46), and can include a respective vertical semiconductor channel 60 and a respective memory film 50. The metal line structures (142, 140) can comprise bit lines that are electrically connected to a respective subset of the memory stack structures 55.

The various embodiments of the present disclosure can be employed to provide MOF material portions between laterally neighboring pairs of metal line structures (142, 140). The MOF material portions can include a low dielectric constant (low-k) dielectric material having a dielectric constant in a range from 1.7 to 2.6 without any cavity therein, or a dielectric constant in a range from 1.3 to 2.3 if encapsulated voids (i.e., airgaps) 139 are formed within the MOF material portions. The low dielectric constant provided by the MOF material portions can reduce capacitive coupling between the laterally neighboring pairs of metal line structures (142, 140) such as bit lines 140B, can reduce the RC delay in signal propagation in the metal line structures (142, 140), and can increase performance of a semiconductor device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A structure, comprising:
   metal line structures having a bottom surface contacting a respective first segment of a planar top surface of a first dielectric layer that is located over a substrate, wherein the metal lines are laterally spaced apart from each other, wherein each of the metal line structures comprises a planar metallic liner including a first metal element and a metal line body portion comprising a second metal element that is different from first metal element; and
   metal-organic framework (MOF) material portions located between neighboring pairs of the metal line structures and comprising metal ions or clusters of the first metal element and organic ligands connected to the metal ions or clusters of the first metal element, wherein each of the MOF material portions is in direct contact with a sidewall of a respective one of the metal line structures, in direct contact with a peripheral segment of a top surface of the respective one of the metal line structures, and in direct contact with a respective second surface segment of the planar top surface of the first dielectric layer.

2. The structure of claim 1, wherein each of the planar metallic liners has a uniform thickness throughout.

3. The structure of claim 2, wherein:
one of the metal line structures comprises a first planar metallic liner of the planar metallic liners and a first metal line body portion of the metal line body portions;
the first planar metallic liner has a first width; and
the first metal line body portion has a second width that is greater than the first width.

4. The structure of claim 3, wherein a lateral offset distance between a sidewall of the first planar metallic liner and a sidewall of the first metal line body portion is one half of a difference between the second width and the first width.

5. The structure of claim 1, wherein the first dielectric layer comprises a first via-level dielectric layer located between the substrate and a horizontal plane including bottom surfaces of the planar metallic liners, wherein the planar metallic liners contact a top surface of the first via-level dielectric layer.

6. The structure of claim 5, further comprising first conductive via structures embedded in the first via-level dielectric layer and contacting a bottom surface of a respective one of the planar metallic liners.

7. The structure of claim 6, further comprising a second via-level dielectric layer located over the metal line structures and embedding second conductive via structures therein.

8. The structure of claim 7, wherein a bottommost surface of the second via-level dielectric layer does not contact the first via-level dielectric layer, and is vertically spaced from the first via-level dielectric layer by one of the MOF material portions.

9. The structure of claim 7, wherein an entirety of a volume located between a neighboring pair of metal line structures and between the first via-level dielectric layer and the second via-level dielectric layer is filled with one of the MOF material portions.

10. The structure of claim 7, wherein the second via-level dielectric layer comprises downward-protruding portions that contact sidewalls of the MOF material portions.

11. The structure of claim 10, wherein the second via-level dielectric layer contacts portions of the top surface of the first via-level dielectric layer.

12. The structure of claim 7, wherein airgaps are located between neighboring pairs of the MOF material portions between the first via-level dielectric layer and the second via-level dielectric layer.

13. The structure of claim 1, wherein:
the planar metallic liners consist essentially of atoms of the first metal element; and
the first metal element is one of titanium, molybdenum, copper, cobalt, zirconium, zinc, manganese, or ruthenium.

14. The structure of claim 1, further comprising:
an alternating stack of insulating layers and electrically conductive layers located between the substrate and the metal line structures;
memory stack structures vertically extending through the alternating stack and including a respective vertical semiconductor channel and a respective memory film, wherein the metal line structures comprise bit lines that are electrically connected to a respective subset of the memory stack structures.

15. The structure of claim 1, wherein each of the MOF material portions is in direct contact with a sidewall of a respective one of the planar metallic liners and with a sidewall of a respective one of the metal line body portions.

16. The structure of claim 1, wherein an entirety of each of the planar metallic liners is located between a first horizontal plane including the planar top surface of the first dielectric layer and a second horizontal plane including bottom surfaces of the metal line body portions.

17. The structure of claim 1, wherein:
the planar metallic liners have a first width; and
the metal line body portions have a second width that is greater than the first width.

18. The structure of claim 17, wherein one of the MOF material portions is in direct contact with a segment of a bottom surface of the metal line body portion within the one of the metal line structures.

19. The structure of claim 1, further comprising a second dielectric layer overlying the metal line structures, wherein each of the metal line structures comprises a respective top surface having a center segment that contacts the second dielectric layer.

20. The structure of claim 19, wherein the second dielectric layer is in direct contact with third surface segments of the planar top surface of the first dielectric layer.

* * * * *